(12) United States Patent
Hsin et al.

(10) Patent No.: US 12,550,352 B2
(45) Date of Patent: Feb. 10, 2026

(54) SEMICONDUCTOR STRUCTURE AND MANUFACTURING METHOD THEREOF

(71) Applicant: TAIWAN SEMICONDUCTOR MANUFACTURING COMPANY, LTD., Hsinchu (TW)

(72) Inventors: Bo-Huan Hsin, Taichung (TW); Ying-Han Chiou, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 704 days.

(21) Appl. No.: 17/882,465

(22) Filed: Aug. 5, 2022

(65) Prior Publication Data
US 2024/0047562 A1    Feb. 8, 2024

(51) Int. Cl.
*H10D 30/01* (2025.01)
*H10D 30/62* (2025.01)
*H10D 62/10* (2025.01)
*H10D 84/01* (2025.01)
*H10D 84/03* (2025.01)
*H10D 84/85* (2025.01)

(52) U.S. Cl.
CPC ....... *H10D 30/024* (2025.01); *H10D 30/6211* (2025.01); *H10D 62/115* (2025.01); *H10D 84/017* (2025.01); *H10D 84/0184* (2025.01); *H10D 84/0188* (2025.01); *H10D 84/0193* (2025.01); *H10D 84/038* (2025.01); *H10D 84/853* (2025.01)

(58) Field of Classification Search
CPC .... H10D 84/017; H10D 30/62; H10D 84/834; H10D 84/013; H10D 84/0128; H10D 84/0151; H10D 84/0158; H10D 64/512
See application file for complete search history.

(56) References Cited

U.S. PATENT DOCUMENTS

| | | | |
|---|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |

(Continued)

FOREIGN PATENT DOCUMENTS

| | | | |
|---|---|---|---|
| KR | 20160140321 A | 12/2016 |
| KR | 20200045398 A | 5/2020 |

(Continued)

*Primary Examiner* — Fernando L Toledo
*Assistant Examiner* — Adam S Bowen
(74) *Attorney, Agent, or Firm* — Maschoff Brennan

(57) ABSTRACT

A method includes forming a semiconductor fin upwardly extending from a substrate; forming a gate strip extending across the semiconductor fin; forming source/drain regions on the semiconductor fin and at opposite sides of the gate strip; forming a gate spacer on a sidewall of the gate strip; forming a film layer on the gate spacer; performing an etching process on the gate strip to break the gate strip into a first gate structure and a second gate structure, the etching process further consuming the gate spacer while remains the film layer; forming an isolation structure interposing the first and second gate structures.

20 Claims, 27 Drawing Sheets

(56) References Cited

U.S. PATENT DOCUMENTS

| | | |
|---|---|---|
| 9,576,814 B2 | 2/2017 | Wu et al. |
| 9,831,183 B2 | 11/2017 | Lin et al. |
| 9,859,386 B2 | 1/2018 | Ho et al. |
| 11,348,917 B2 | 5/2022 | Wang et al. |
| 2020/0135726 A1* | 4/2020 | Fan ..................... H10D 84/834 |
| 2020/0381526 A1* | 12/2020 | Jeon .................... H10D 62/116 |
| 2021/0328043 A1 | 10/2021 | Lin et al. |
| 2022/0059685 A1 | 2/2022 | Wang et al. |
| 2022/0173225 A1 | 6/2022 | Lin et al. |
| 2022/0190153 A1 | 6/2022 | Cheng et al. |
| 2022/0415890 A1* | 12/2022 | Hasan .................. H10D 64/017 |

FOREIGN PATENT DOCUMENTS

| | | |
|---|---|---|
| KR | 20210098819 A | 8/2021 |
| TW | 202209682 A | 3/2022 |

* cited by examiner

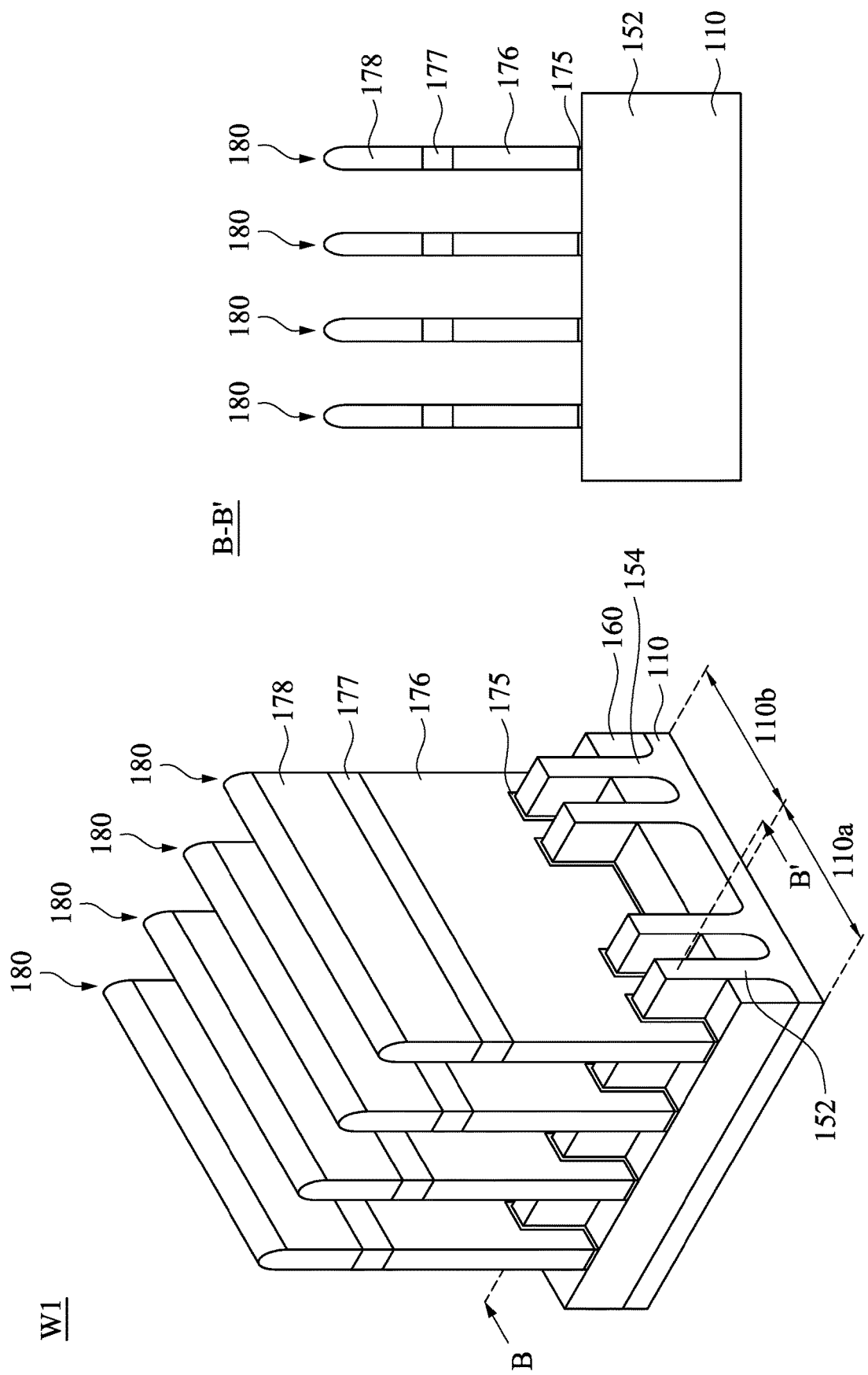

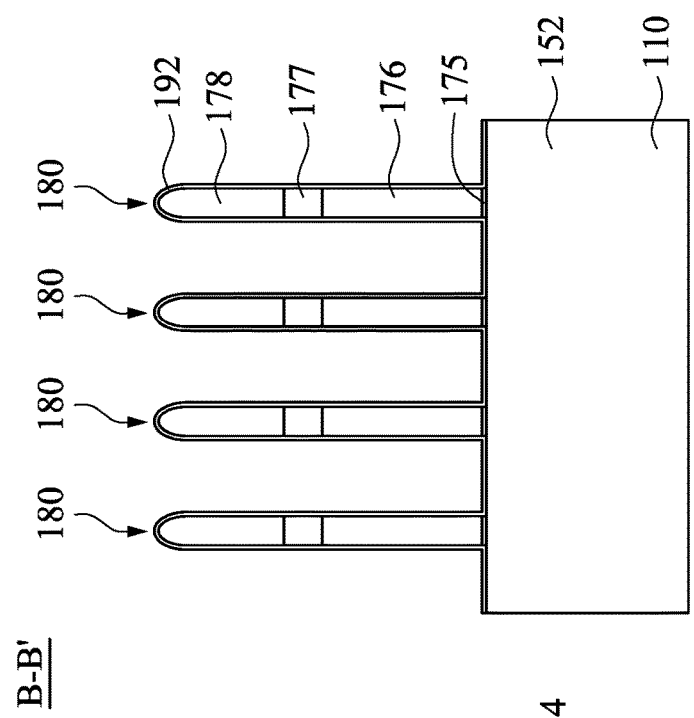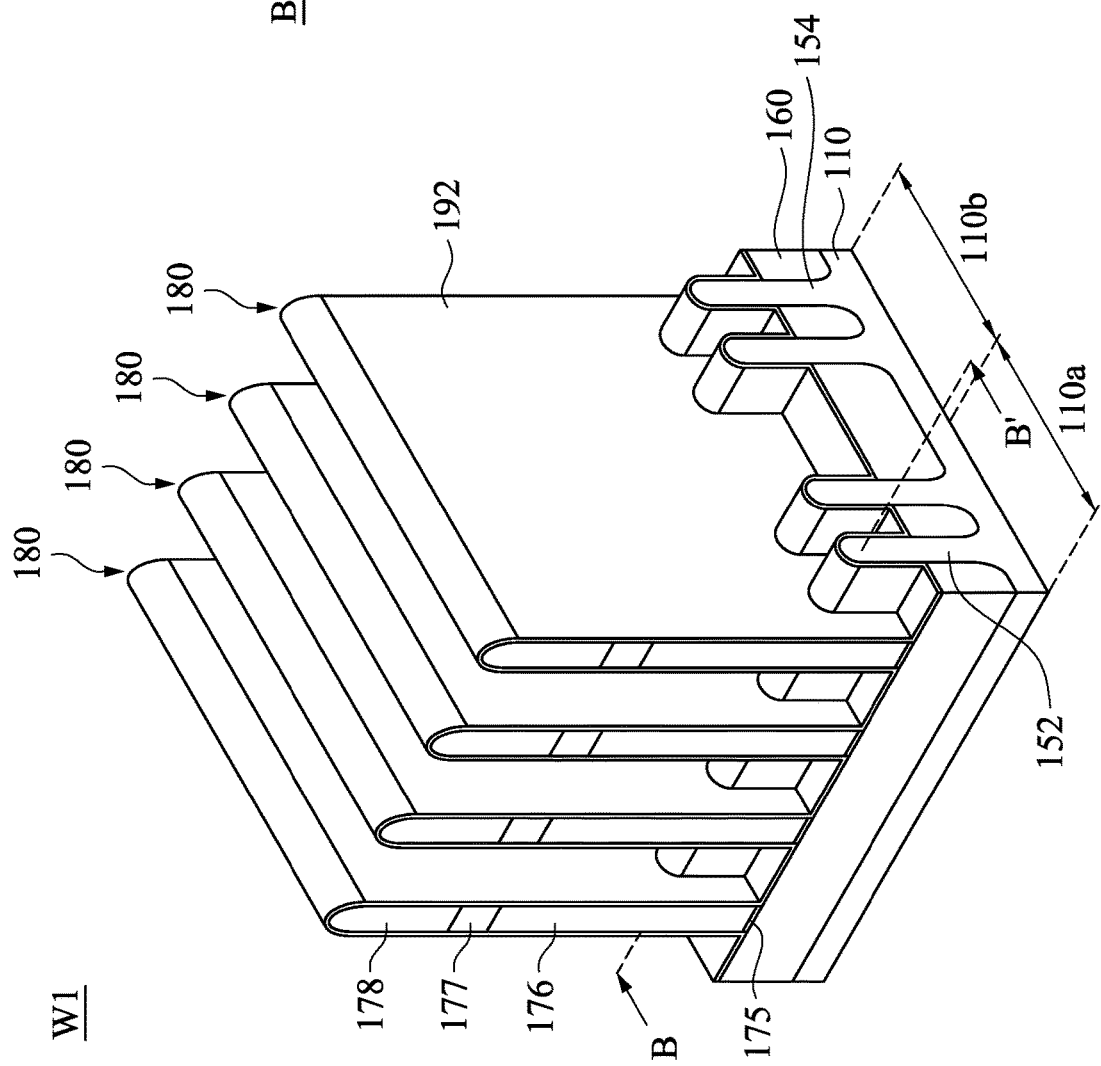

C-C'

D-D'

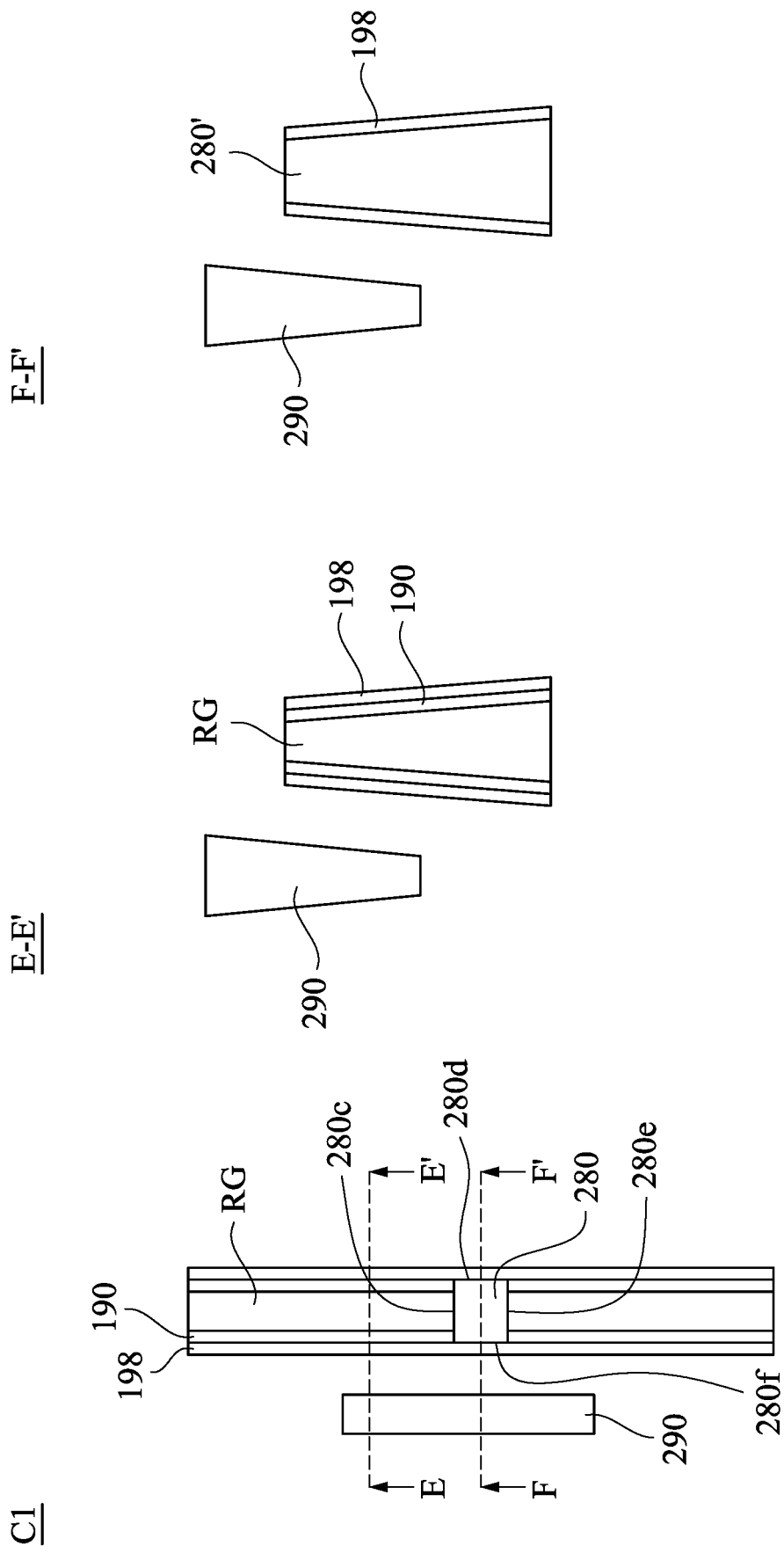

SEMICONDUCTOR STRUCTURE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 to 21D illustrate schematic views of intermediate stages in the formation of a semiconductor structure over a substrate in accordance with some embodiments.

DETAILED DESCRIPTION

Figure 1:
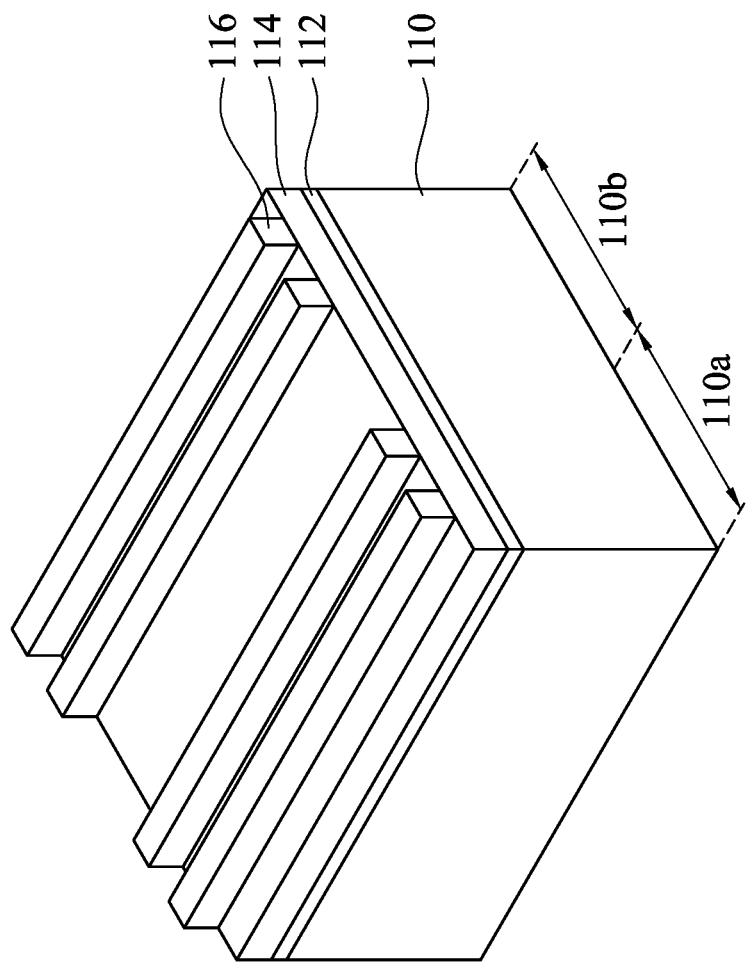

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. The double-patterning or the multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In the course of IC evolution, functional density (i.e., the number of interconnected devices per chip area) has generally increased while geometry size (i.e., the smallest component (or line) that can be created using a fabrication process) has decreased. However, the formation of the gate pattern will face difficulty when the gate pitch shrinks, which in turn forms a leakage path between the metal gate and internal contact structure (e.g., source/drain contact) due to overlay (OVL) shift issue or etch process ability. In some embodiments, the etching process on the gate pattern would consume gate spacer and further etch the dielectric layer surrounding the gate pattern, which will result in the material of the gate pattern (e.g., TiN) flowing into the surrounding dielectric layer, which in turn occurs a leakage current to flow between the gate pattern and a source/drain contact formed subsequently in the surrounding dielectric layer.

Therefore, the present disclosure in various embodiments provides a film layer formed on the gate spacer. During the etching process on the gate pattern, the film layer have a higher etch resistance to an etchant of the etching process than the gate spacer, which in turn allows for resisting against the etching process. Therefore, the film layer can prevent a leakage current from occurring between the gate pattern and a source/drain contact formed subsequently in the surrounding dielectric layer, and then can be served as a leakage barrier.

Reference is made to FIGS. 1-21D. FIGS. 1, 2, 3, 4, 5, 6A, 7A, 8A, 9A, 10A, 11A, 12A, 13A, 14, 15, 16, 17, 18A, 19A, 20A, and 21A illustrate perspective views of intermediate stages of a semiconductor structure in accordance with some embodiments. FIGS. 6B, 7B, 8B, 9B, 10B, 11B, 12B, and 13B illustrate cross-sectional views obtained from the reference cross-sections B-B' in FIGS. 6A, 7A, 8A, 9A, 10A, 11A, 12A, and 13 A respectively. FIG. 13C illustrates a cross-sectional view of a semiconductor structure corresponding to FIG. 13B in accordance with some embodiments of the present disclosure. FIGS. 18B, 19B, and 20B illustrate cross-sectional views obtained from the reference cross-sections C-C' in FIGS. 18A, 19A, and 20A, respectively. FIGS. 18C, 19C, and 20C illustrate cross-sectional views obtained from the reference cross-sections D-D' in FIGS. 18A, 19A, and 20A, respectively. FIG. 20D illustrates a cross-sectional view of a semiconductor structure corresponding to FIG. 20C in accordance with some embodiments of the present disclosure. FIG. 21B illustrates a local enlarged top view of a semiconductor structure according to FIG. 21A in the region C1. FIGS. 21C and 21D illustrate cross-sectional views obtained from the reference cross-sections E-E' and F-F' in FIG. 21B, respectively.

Reference is made to FIG. 1. A wafer W1 undergoes a series of deposition and photolithography processes, such that a pad layer 112, a mask layer 114 and a patterned photoresist layer 116 are formed on a substrate 110 of the wafer W1. In some embodiments, the substrate 110 is a semiconductor substrate, such as a bulk semiconductor, a semiconductor-on-insulator (SOI) substrate, or the like. An SOI substrate includes a layer of a semiconductor material formed on an insulator layer. The insulator layer may be, by way of example and not limitation, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 110 may have device regions 110a and 110b, such as logic region or storage region. In some embodiments, the device region 110a may be served as one of the logic region and the storage region, and the device region 110b may be served as another one of the logic region and the storage region. In some embodiments, both of the device regions 110a and 110b are of the logic region. In some embodiments, both of the device regions 110a and 110b are of the storage region. In some embodiments, the semiconductor device in the device regions 110a and 110b may be I/O device, static random access memory (SRAM) device, and core device. In some embodiments, a P-type well and an N-type well in the substrate 110 which divide the substrate 110 into separate regions for different types of devices or transistors. Example materials of the P-type well and the N-type well include, but are not limited to, semiconductor materials doped with various types of p-type dopants and/or n-type dopants. In some embodiments, the P-type well includes p-type dopants, and the N-type well includes n-type dopants. The N-type well is a region for forming p-channel metal-oxide semiconductor (PMOS) transistors, and the P-type well is a region for forming n-channel metal-oxide semiconductor (NMOS) transistors. The described conductivity of the well regions and herein is an example. Other arrangements are within the scope of various embodiments.

In some embodiments, the pad layer 112 is a thin film including silicon oxide formed using, by way of example and not limitation, a thermal oxidation process. The pad layer 112 may act as an adhesion layer between the substrate 110 and mask layer 114. The pad layer 112 may also act as an etch stop layer for etching the mask layer 114. In some embodiments, the mask layer 114 is formed of silicon nitride, by way of example and not limitation, using low-pressure chemical vapor deposition (LPCVD) or plasma enhanced chemical vapor deposition (PECVD). The mask layer 114 is used as a hard mask during subsequent photolithography processes. The photoresist layer 116 is formed on the mask layer 114 and is then patterned, forming openings in the photoresist layer 116, so that regions of the mask layer 114 are exposed.

Figure 2:
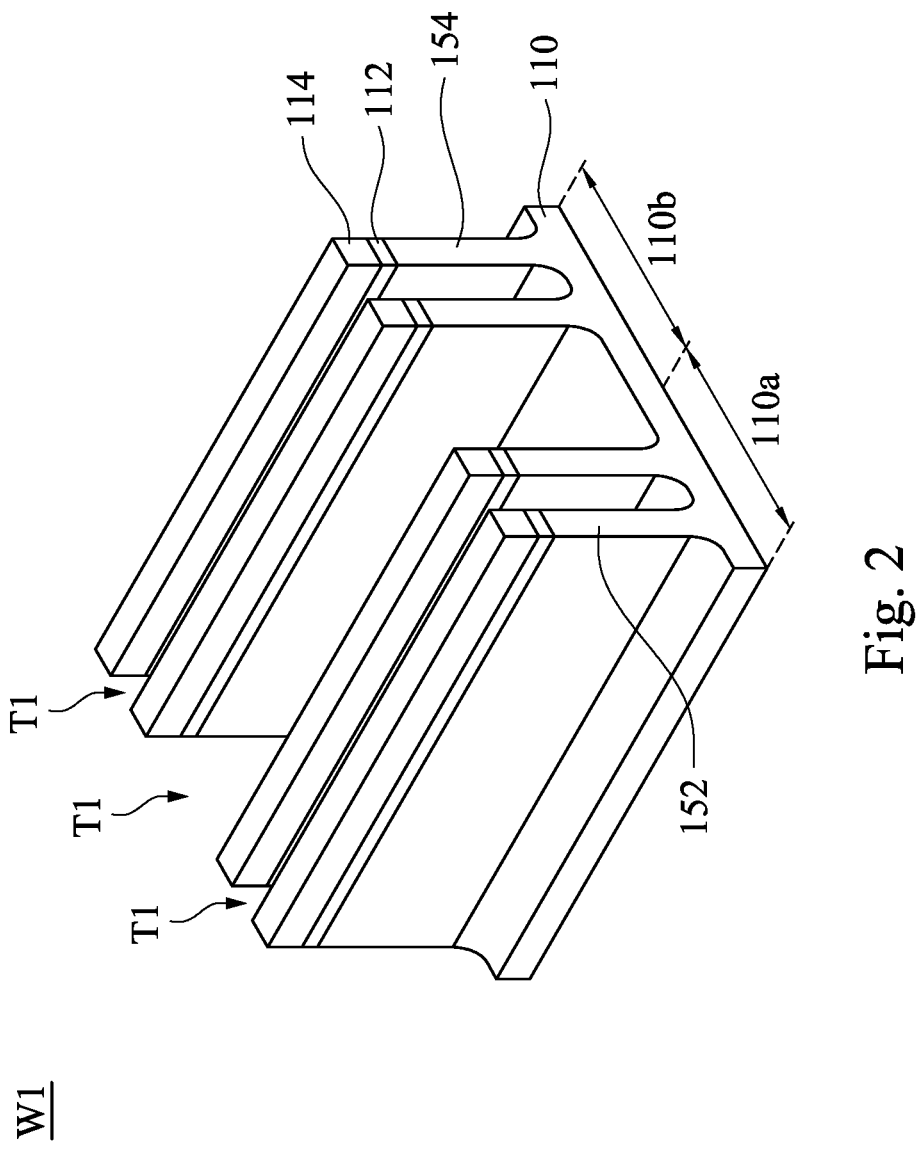

Reference is made to FIG. 2. The mask layer 114 and pad layer 112 are etched through the photoresist layer 116, exposing the underlying substrate 110. The exposed substrate 110 is then etched, forming trenches T1. Portions of the substrate 110 between the neighboring trenches T1 within the device region 110a can be referred to as semiconductor fin 152. Portions of the substrate 110 between the neighboring trenches T1 within the device region 110b can be referred to as a semiconductor fin 154. After etching the substrate 110, the photoresist layer 116 is removed. Next, a cleaning step may be optionally performed to remove a native oxide of the semiconductor substrate 110. The cleaning may be performed using diluted hydrofluoric (HF) acid, by way of example and not limitation. According to the various aspects of the present disclosure, the semiconductor fins extend along a first direction. In some embodiments, the semiconductor fins 152 and 154 may also be referred to as oxide-definition (OD) regions, semiconductive channel patterns, or nanostructured pedestals each having a top surface and opposite side surfaces.

Figure 3:
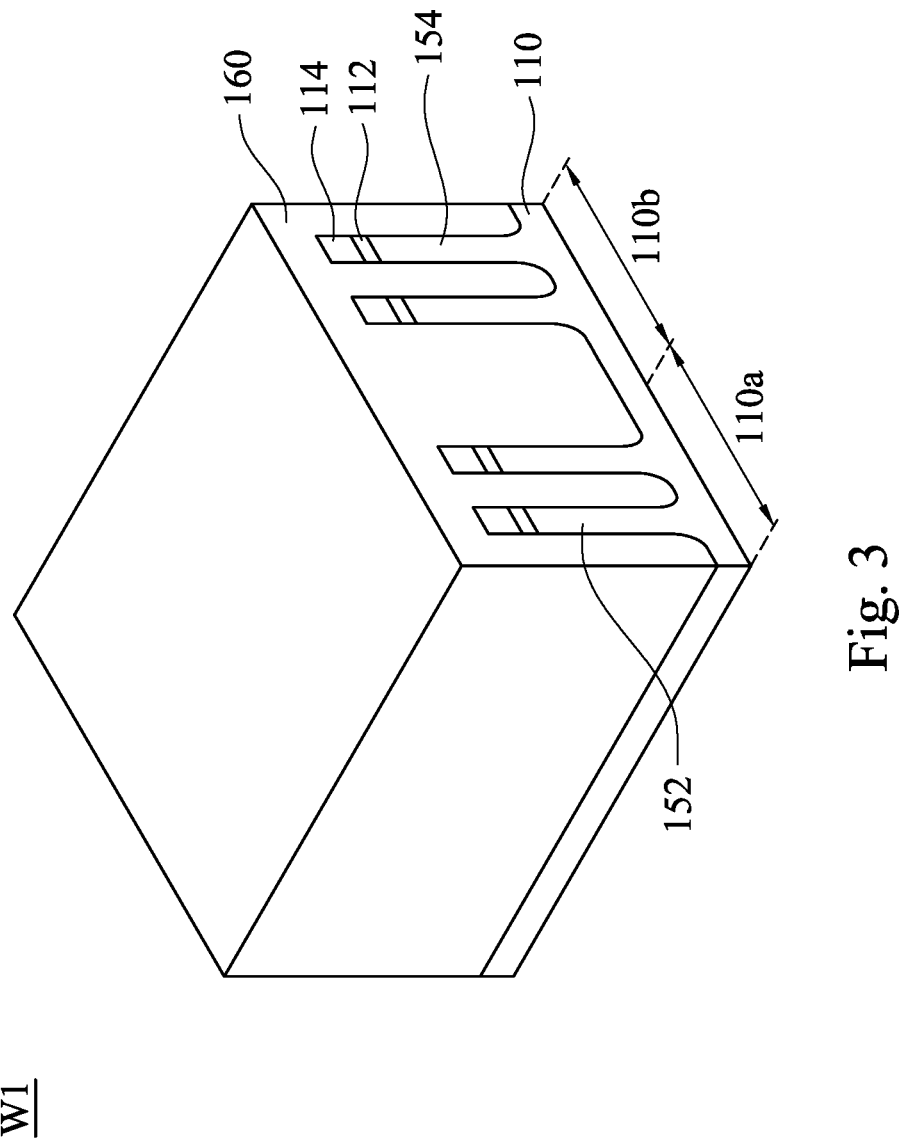

Reference is made to FIG. 3. A dielectric layer 160 is formed to overfill the trenches T1 and cover the semiconductor fins 152 and 154. The dielectric layer 160 in the trenches T1 can be referred to as a shallow trench isolation (STI) structure. In some embodiments, the dielectric layer 160 may be made of low-K dielectric materials. By way of example but not limiting the present disclosure, the dielectric layer 160 may be made of silicon oxide, silicon nitride, silicon oxynitride, fluoride-doped silicate glass (FSG), silicon carbide, silicon nitride, the like, or a combination thereof. In some embodiments, the dielectric layer 160 may be formed using flowable chemical vapor deposition (FCVD), spin-on coating, CVD, ALD, high-density plasma chemical vapor deposition (HDPCVD), LPCVD, the like, or a combination thereof. In some embodiments where FCVD is used to form the dielectric layer 160, a silicon- and nitrogen-containing precursor (for example, trisilylamine (TSA) or disilylamine (DSA)) is used, and hence the resulting dielectric layer 160 is flowable (jelly-like). In some embodiments, the dielectric layer 160 is formed using an alkylamino silane based precursor. During the deposition of the dielectric layer 160, plasma is turned on to activate the gaseous precursors for forming the flowable oxide. In some embodiments, the dielectric layer 160 may be formed using silane ($SiH_4$) and oxygen ($O_2$) as reacting precursors. In some embodiments, the dielectric layer 160 may be formed using a sub-atmospheric CVD (SACVD) process or high aspect-ratio process (HARP), in which process gases may include tetraethylorthosilicate (TEOS) and ozone ($O_3$). In some embodiments, the dielectric layer 160 may be formed using a spin-on-dielectric (SOD) process, such as hydrogen silsesquioxane (HSQ) or methyl silsesquioxane (MSQ). Other processes and materials may be used. In some embodiments, the dielectric layer 160 can be interchangeably referred to a flowable oxide, a dielectric material, or cured flowable oxide material.

Figure 4:
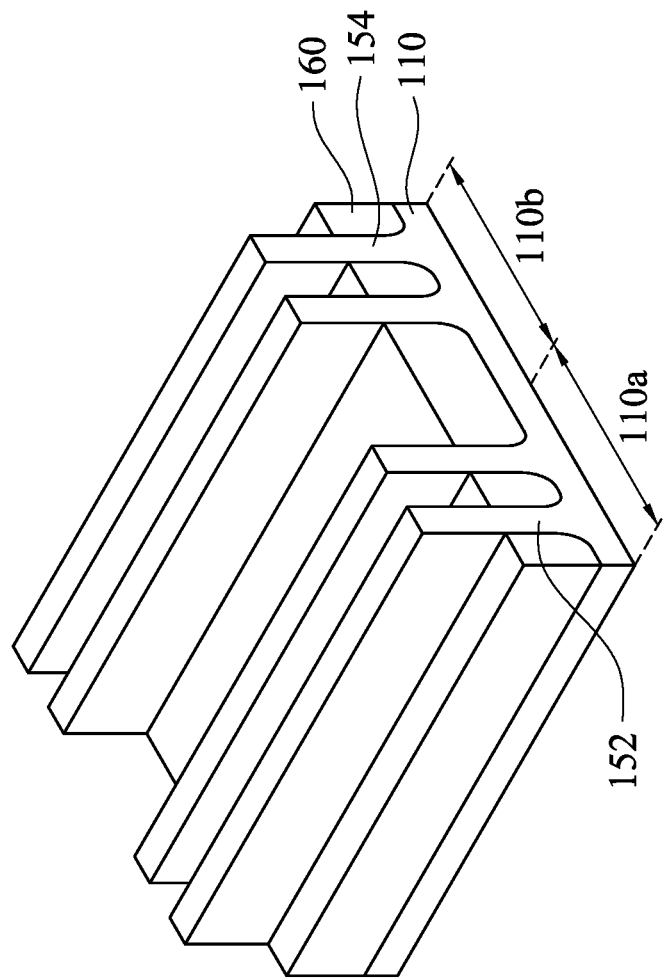

Reference is made to FIG. 4. A planarization process such as chemical mechanical polish (CMP) is performed to remove the excess dielectric layer 160 over the semiconductor fins 152 and 154. In some embodiments, the planarization process may also remove the mask layer 114 and the pad layer 112 such that top surfaces of the semiconductor fins 152 and 154 are exposed. In some embodiments, the planarization process stops when the mask layer 114 is exposed. In such embodiments, the mask layer 114 may act as the CMP stop layer in the planarization. If the mask layer 114 and the pad layer 112 are not removed by the planarization process, the mask layer 114, if formed of silicon nitride, may be remove by a wet process using hot $H_3PO_4$, and the pad layer 112, if formed of silicon oxide, may be removed using diluted HF. Subsequently, the dielectric layer 160 are recessed, for example, through an etching operation, in which diluted HF, SiCoNi (including HF and NH 3), or the like, may be used as the etchant. After recessing the dielectric layer 160, portions of the semiconductor fins 152 and 154 are higher than a top surface of the dielectric layer 160.

It is understood that the processes described above are merely an example of how the semiconductor fins 152 and 154 and the dielectric layer 160 are formed. In some embodiments, a dielectric layer can be formed over a top surface of the substrate 110; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fin. For example, the semiconductor fins 152 and 154 can be recessed, and a material different from the recessed semiconductor fins 152 and 154 is epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in-situ doped during growth, which may obviate prior implanting of the fins although in-situ and implantation doping may be used together. In some embodiments, the semiconductor fins 152 and 154 may include silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, or the like.

Figure 5:
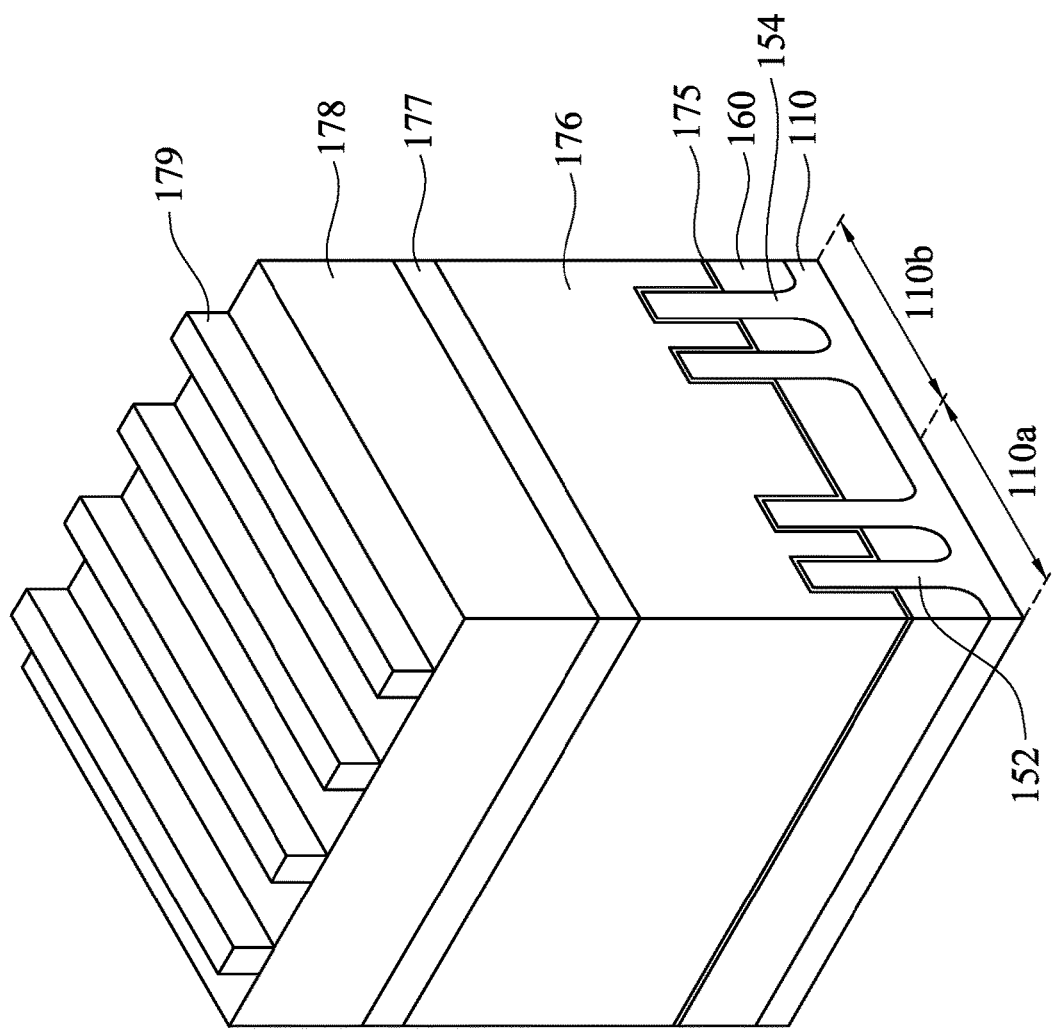

Reference is made to FIG. 5. A gate dielectric layer 175 is blanket formed over the substrate 110 to cover the semiconductor fins 152 and 154 and the dielectric layer 160. In some embodiments, the gate dielectric layer 175 may be made of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multi-layer structure including a plurality of dielectric layers. In some embodiments, the gate dielectric layer 175 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HMO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 175 is an oxide layer. The gate dielectric layer 175 may be formed by a deposition processes, such as chemical vapor deposition (CVD), physical vapor deposition (PVD), atomic layer deposition (ALD), plasma enhanced CVD (PECVD) or other suitable techniques.

Subsequently, a dummy gate electrode layer 176 is formed over the gate dielectric layer 175. In some embodiments, the dummy gate electrode layer 176 may include polycrystalline-silicon (poly-Si), poly-crystalline silicon-germanium (poly-SiGe), metallic nitrides, metallic silicides, metallic oxides, or metals. In some embodiments, the dummy gate electrode layer 176 includes a metal-containing material such as TiN, TaN, TaC, Co, Ru, Al, combinations thereof, or multi-layers thereof. The dummy gate electrode layer 176 may be deposited by CVD, physical vapor deposition (PVD), sputter deposition, or other techniques suitable for depositing conductive materials.

Subsequently, dielectric layers 177 and 178 are formed on the dummy gate electrode layer 176 in sequence. In some embodiments, the dielectric layer 178 may be made of a different material than the dielectric layer 177. In some embodiments, the dielectric layer 177 may be made of a nitrogen-containing material, and the dielectric layer 178 may be made of a nitrogen-free material. By way of example and not limitation, the dielectric layer 177 may be made of a silicon carbo-nitride (SiCN), and the dielectric layer 178 may be made of silicon oxide ($SiO_2$). In some embodiments, the dielectric layer 177 may be made of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multi-layer structure including a plurality of dielectric layers. In some embodiments, the dielectric layer 178 may be made of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multi-layer structure including a plurality of dielectric layers.

Subsequently, a patterned mask layer 179 is formed over the dielectric layer 178 and then patterned to form separated mask portions. The patterned mask layer 179 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes.

The etching processes may include dry etching, wet etching, and/or other etching methods (e.g., reactive ion etching).

Reference is made to FIGS. 6A and 6B. One or more etching processes are performed to form dummy gate structure 180 wrapping around the semiconductor fins 152 and 154 using the patterned mask 179 as an etching mask, and the patterned mask layer 179 may be removed after the etching. The dummy gate structure 180 includes a gate dielectric layer 175 and a dummy gate electrode layer 176 over the gate dielectric layer 175, and dielectric layers 177 and 178 over the dummy gate electrode layer 176. The dummy gate structures 180 have substantially parallel longitudinal axes that are substantially perpendicular to a longitudinal axis of the semiconductor fins 152 and 154. The dummy gate structure 180 will be replaced with a replacement gate structure using a "gate-last" or replacement-gate process. In some embodiments, the dummy gate structure 180 can be interchangeably referred to a gate pattern, a gate strip, or a nanostructured pedestal.

Reference is made to FIGS. 7A to 10B, a multi-layered spacer 190 (see FIG. 10B) is formed over the gate structure 180. With reference to FIGS. 7A and 7B, the first spacer layer 192 is formed over the structure shown in FIGS. 6A and 6B. That is, the first spacer layer 192 is conformally formed over at least the semiconductor fins 152 and 154 and the dummy gate structures 180. In some embodiments, the first spacer layer 192 includes a dielectric material, which may be advantageous to resist against subsequent etching processes, such as etching in a gate replacement process. In some embodiments, the first spacer layer 192 may be made of a dielectric material such as silicon nitride (SiN), silicon oxide (SiO2), silicon carbo-nitride (SiCN), silicon oxynitride (SiON), silicon oxy-carbo-nitride (SiOCN), or the like, and may have a single-layer structure or a multi-layer structure including a plurality of dielectric layers. In some embodiments, the first spacer layer 192 may include low-k carbon-containing materials such as, for example, silicon oxycarbonitride (SiOCN), silicon oxycarbide (SiOC), silicon carbide (SiC), or other suitable dielectric materials. In some embodiments, the first spacer layer 192 may include porous dielectric materials. In some embodiments, the first spacer layer 192 may include other low-k dielectric materials, such as carbon doped silicon dioxide, low-k silicon nitride, low-k silicon oxynitride, polyimide, spin-on glass (SOG), fluoride-doped silicate glass (FSG), phosphosilicate glass (PSG), borophosphosilicate glass (BPSG), Xerogel, Aerogel, amorphous fluorinated carbon, Parylene, BCB (bis-benzocyclobutenes), other suitable low-k dielectric materials, and/or combinations thereof. In some embodiments, the first spacer layer 192 may be formed by a deposition process, such as an atomic layer deposition (ALD) process, a physical vapor deposition (PVD) process, a sputter deposition process, a chemical vapor deposition (CVD) process such as plasma enhanced CVD (PECVD), low pressure CVD (LPCVD), atomic layer CVD (ALCVD), or other suitable techniques.

Figures 8A, 8B:
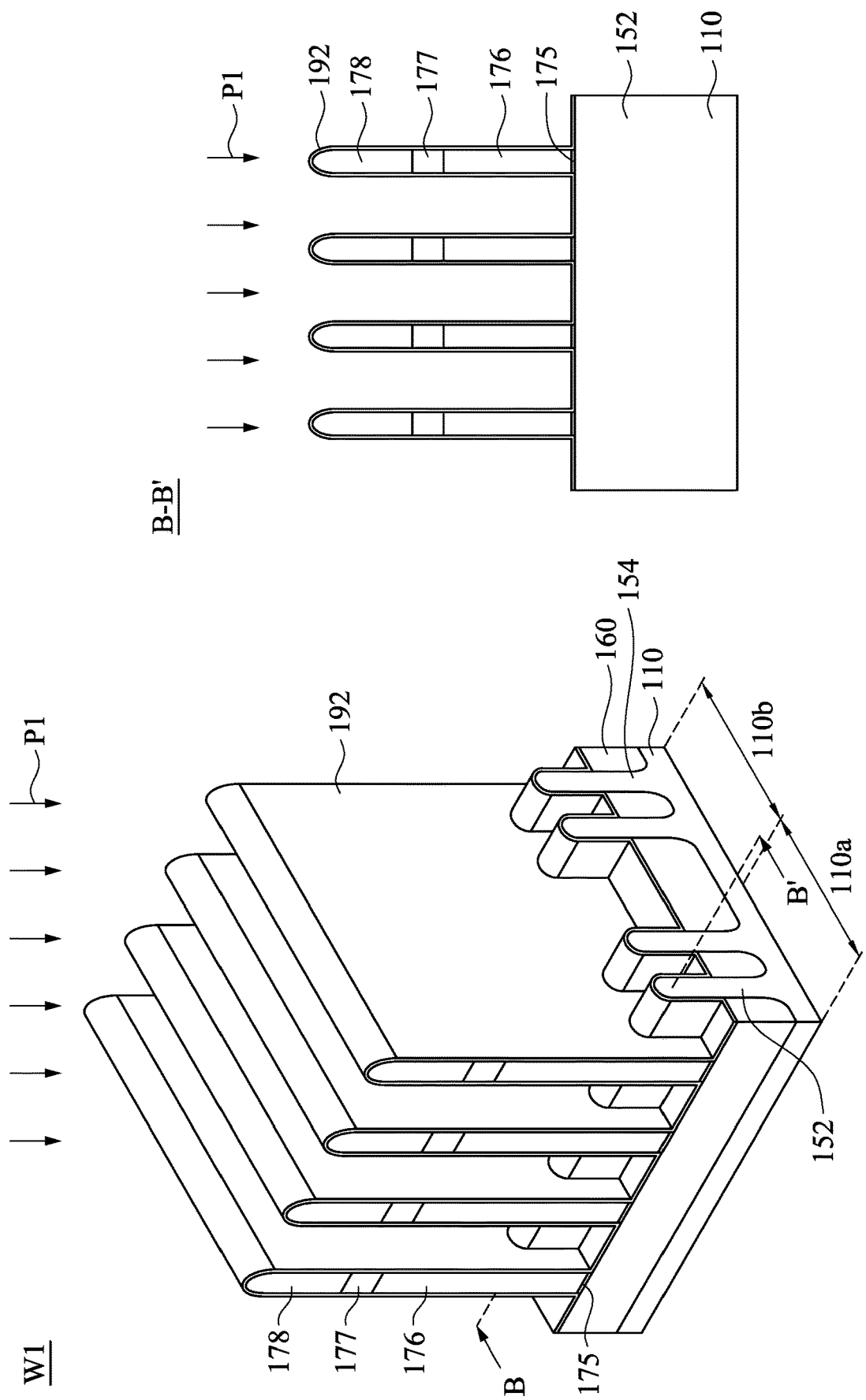

Reference is made to FIGS. 8A and 8B. At least one conductive type region is formed in the substrate by implantation process P1, such as a lightly-doped drain (LDD) process. In some embodiments, the substrate 50 may have an n-type region and a p-type region by performing the implantation process P1. The n-type region can be for forming n-type devices, such as NMOS transistors, e.g., n-type FETs, and the p-type region can be for forming p-type devices, such as PMOS transistors, e.g., p-type FETs. The n-type region may be physically separated from or in contact with the p-type region (not separately illustrated), and any number of device features (e.g., other active devices, doped regions, isolation structures, etc.) may be disposed between the n-type region and the p-type region. By way of example but not limiting the present disclosure, the device region 110a may be lightly doped with an n-type impurity to form an implantation region. A photoresist layer may be formed over the device region 110b. In accordance with some embodiments, the photoresist layer can be patterned so that a first opening may be formed over the device region 110a. Subsequently, a first step of the implantation process P1 can be performed through the first opening to dope an n-type dopant in the device region 110a such that the n-type region may be formed in the device region 110a. In some embodiments, the n-type dopant may include arsenic (As), antimony (Sb), phosphorous (P), or the like. By way of example but not limiting the present disclosure, the device region 110b may be lightly doped with a p-type impurity to form an implantation region. A photoresist layer may be formed over the device region 110a. In accordance with some embodiments, the photoresist layer can be patterned so that a second opening may be formed over the device region 110b. Subsequently, a second step of the implantation process P1 can be performed through the second opening to dope an p-type dopant in the device region 110b such that the p-type region may be formed in the device region 110b. In some embodiments, the p-type dopant may include boron (B), or the like.

Figure 9B:
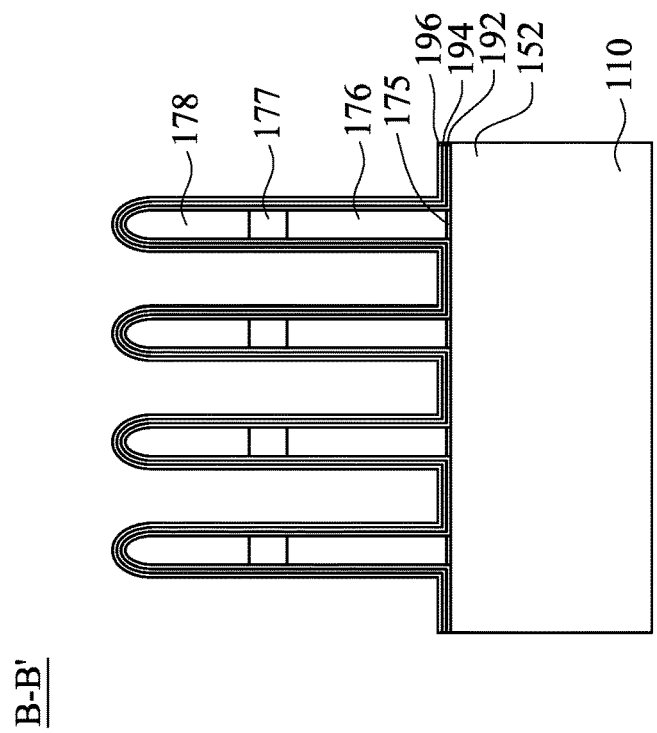
Figure 9A:
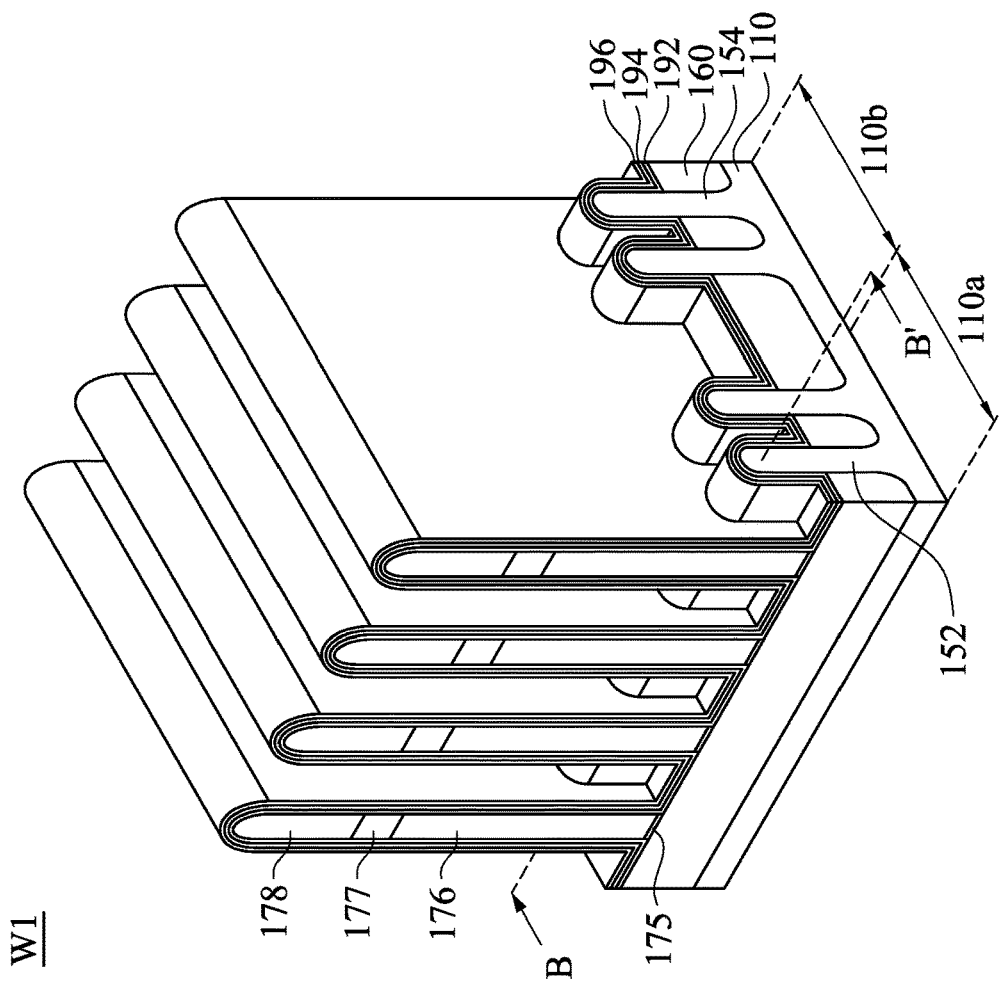

Reference is made to FIGS. 9A and 9B. A second spacer layer 194 is formed on the first spacer layer 192, and the second spacer layer 194 is conformal to the first spacer layer 192. In some embodiments, the second spacer layer 194 includes a dielectric material, which may be advantageous to reduce a parasitic capacitance between a metal gate stack and a contact plug formed in subsequent steps. A resistive-capacitive (RC) time delay caused by the parasitic capacitance, therefore, can be decreased. In some embodiments, the second spacer layer 194 may be made of a material different than that of the first spacer layer 192. In some embodiments, the second spacer layer 194 has a dielectric constant less than that of the first spacer layer 192. For example, the second spacer layer 194 may include a low-k dielectric material having a dielectric constant less than a dielectric constant of silicon oxide ($SiO_2$), which is about 3.9. Moreover, the second spacer layer 194 and the first spacer layer 192 may have different etch properties. For example, the first and second spacer layers 142 and 144 have different etch resistance properties. That is, the first spacer layer 192 may be made of a material which has higher etch resistance to an etchant used to etch the second spacer layer 194, which in turn allows for resisting against subsequent etching processes, such as etching in a gate replacement process. In some embodiments, the second spacer layer 194 is made of a different material than the first spacer layer 192. In some embodiments, the second spacer layer 194 is made of a same material (e.g., silicon oxynitride (SiON)) as the first spacer layer 192 and has a lower oxygen atomic concentration than the first spacer layer 192.

In some embodiments, the second spacer layer 194 may be made of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multi-layer structure including a plurality of dielectric layers. In some embodiments, the second spacer layer 194 may include low-k carbon-containing materials such as, for example, silicon oxynitride (SiON) silicon oxycarbonitride (SiOCN), silicon oxycarbide (SiOC), silicon carbide (SiC), or other suitable dielectric materials. In some embodiments, the second spacer layer 194 may include porous dielectric materials. In some embodiments, the second spacer layer 194 may include other low-k dielectric materials, such as carbon doped silicon dioxide, low-k silicon nitride, low-k silicon oxynitride, polyimide, spin-on glass (SOG), fluoride-doped silicate glass (FSG), phosphosilicate glass (PSG), borophosphosilicate glass (BPSG), Xerogel, Aerogel, amorphous fluorinated carbon, Parylene, BCB (bis-benzocy-clobutenes), other suitable low-k dielectric materials, and/or combinations thereof. In some embodiments, the second spacer layer 194 may be formed by a deposition process, such as an atomic layer deposition (ALD) process, a physical vapor deposition (PVD) process, a sputter deposition process, a chemical vapor deposition (CVD) process such as plasma enhanced CVD (PECVD), low pressure CVD (LPCVD), or atomic layer CVD (ALCVD), or other suitable techniques.

Subsequently, a third spacer layer 196 is formed on the second spacer layer 194, and the third spacer layer 196 is conformal to the second spacer layer 194. In some embodiments, the third spacer layer 196 includes a dielectric material. In some embodiments, the third spacer layer 196 may be made of a material different than that of the second spacer layer 194. In some embodiments, the second spacer layer 194 has a dielectric constant less than that of the third spacer layer 196. Moreover, the third spacer layer 196 and the second spacer layer 194 may have different etch properties. For example, the second and third spacer layers 194 and 194 have different etch resistance properties. That is, the third spacer layer 196 may be made of a material which has higher etch resistance to an etchant used to etch the second spacer layer 194, which in turn allows for resisting against subsequent etching processes. In some embodiments, the third spacer layer 196 has a higher oxygen atomic concentration than the second spacer layer 194.

In some embodiments, the third spacer layer 196 may include oxide-free dielectric material. For example, the third spacer layer 196 may include silicon nitride or another suitable material. In some embodiments, the third spacer layer 196 may include carbon-free dielectric material. For example, the third spacer layer 196 may include silicon oxide, silicon nitride, silicon oxy-nitride, or another suitable material. In some embodiments, the third spacer layer 196 includes non-porous dielectric materials. In some embodiments, the third spacer layer 196 may be formed by a deposition process, such as an atomic layer deposition (ALD) process, a physical vapor deposition (PVD) process, a sputter deposition process, a chemical vapor deposition (CVD) process such as plasma enhanced CVD (PECVD), low pressure CVD (LPCVD), or atomic layer CVD (ALCVD), or other suitable techniques.

Figures 10A, 10B:
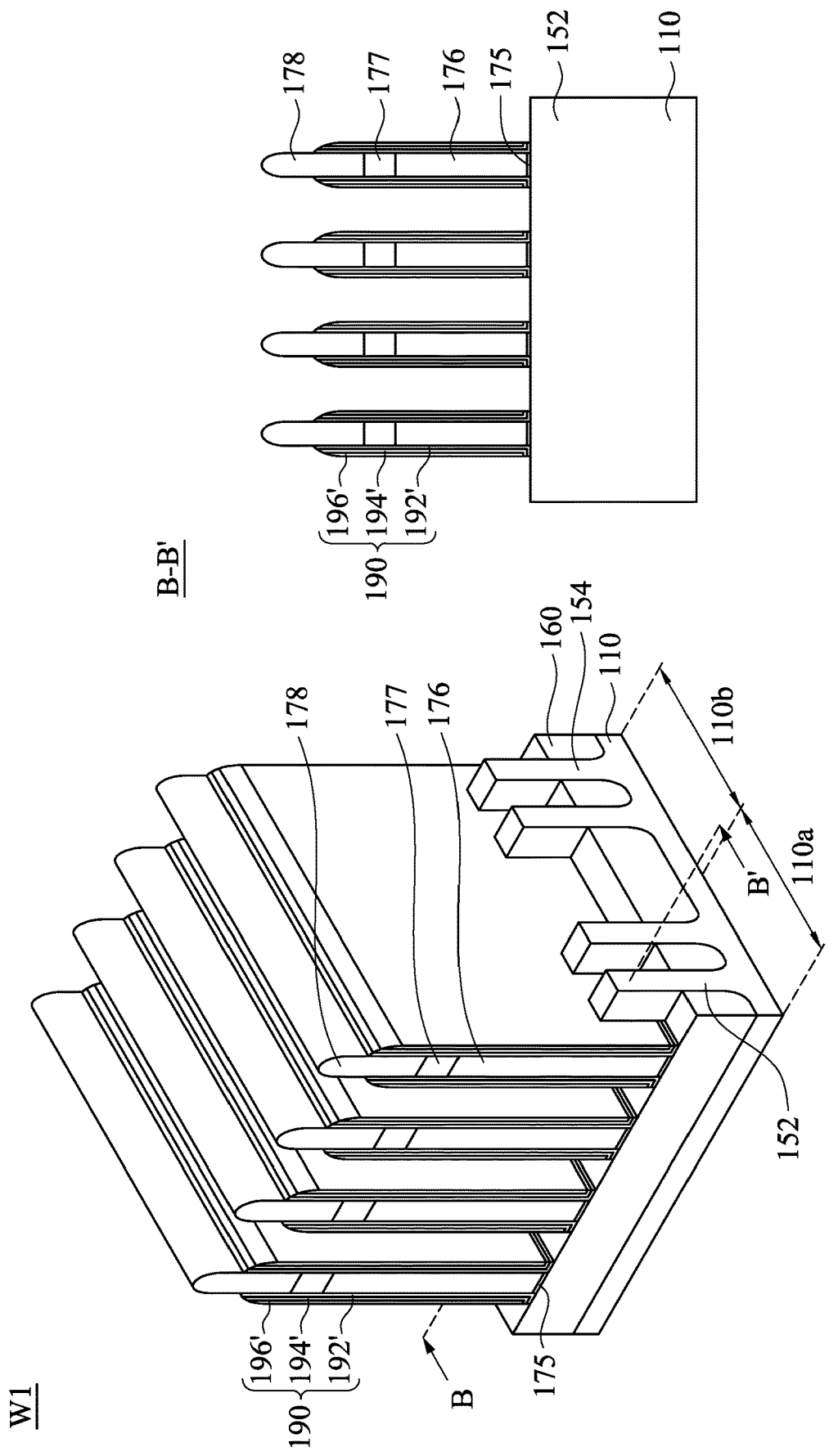

Reference is made to FIGS. 10A and 10B. The multi-layered gate spacer 190 (see FIG. 10B) is formed along sidewalls of the dummy gate structures 180 by performing an etching process, such as anisotropic etching, to remove horizontal portions of the first, second, and third spacer layers 192, 194, and 196. The remaining portions of the first, second, and third spacer layers 192, 194, and 196 on sidewalls of the gate structure 180 can serve as the gate spacer 190 including first, second, and third spacers 192', 194', and 196'. In some embodiments, the gate spacer 190 may be used to offset subsequently formed doped regions, such as source/drain regions. The gate spacer 190 may further be used for designing or modifying the source/drain region profile.

Figures 11A, 11B:
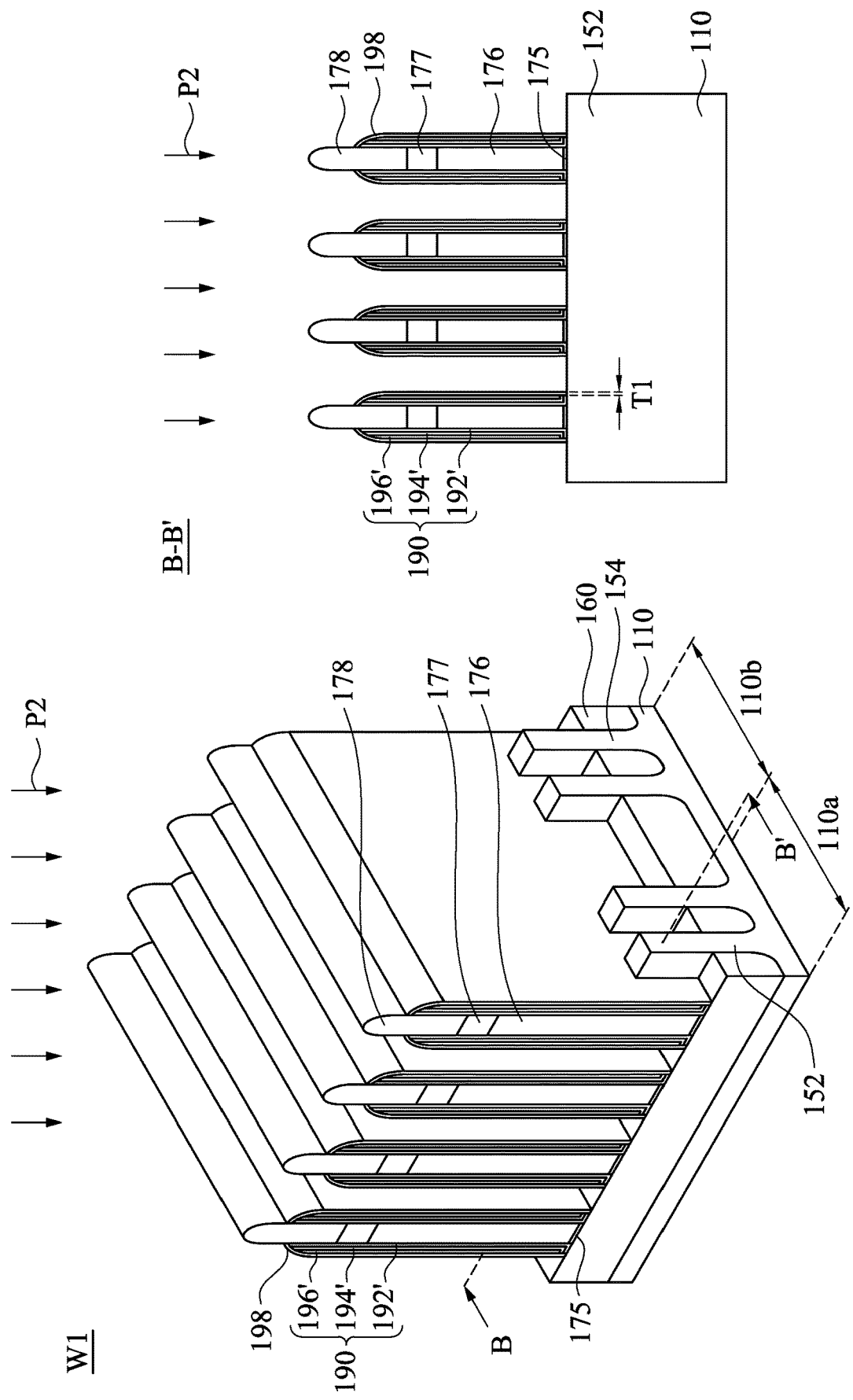

Reference is made to FIGS. 11A and 11B. Film layers 198 are selectively formed on the third spacers 196' and conformal to the gate spacer 190. In some embodiments, the third spacer layer 146 can be made of a material, which may be advantageous to resist against subsequent etching processes. This is described in greater detail with reference to FIGS. 11A, 11B, 18 and 20, the film layers 198 are formed to confined an isolation structure (see FIGS. 20B and 20C) subsequently formed therebetween in case of the gate spacer 190 or the interlayer dielectric (ILD) layer 240 (see FIGS. 20B and 20C) is consumed during a subsequent etching process for forming an opening (see FIG. 18C) occupied by the isolation structure (see FIGS. 20B and 20C), which in turn prevents a leakage current from flowing between the replacement gate structure RG and the source/drain contact 290. In some embodiments, the film layer 198 can be interchangeably referred to as a leakage barrier. Therefore, the film layer 198 may have a different etch property than the gate spacer 190 (see FIG. 13A) and the ILD layer 240 (see FIG. 15). For example, the film layer 198 may have a different etch resistance property than the gate spacer 190 and the ILD layer 240. That is, the film layer 198 may be made of a material which has higher etch resistance to an etchant used to etch the gate spacer 190 and/or the ILD layer 240, which in turn allows for resisting against subsequent etching processes.

In some embodiments, the film layer 198 may be made of a material different than at least one of the first, second, and third spacers 192', 194', and 196' and the ILD layer 240. In some embodiments, the film layer 198 may have film layer has a lower nitrogen atomic concentration than the third spacer 196'. By way of example and not limitation, the film layer 198 may be nitrogen-free. In some embodiments, the film layer 198 may have a different silicon atomic concentration than the ILD layer 240. By way of example and not limitation, the film layer 198 may be made of a same material as the ILD layer 240 and have a higher silicon atomic concentration than the ILD layer 240. The film layer 198 may be made of a same material as the ILD layer 240 and have a less silicon atomic concentration than the ILD layer 240. In some embodiments, the film layer 198 may have a different density than the ILD layer 240. By way of example and not limitation, the film layer 198 may be made of a same material as the ILD layer 240 and have a greater density than the ILD layer 240. The film layer 198 may be made of a same material as the ILD layer 240 and have a less density than the ILD layer 240.

In particular, the selective deposition process P2 may be performed to selectively form on the gate spacer 190 rather than on the surrounding structures (e.g. the semiconductor fins 152 and 154, the dielectric layer 160, and the dielectric layer 178). In some embodiments, the dielectric material included in the film layer 198 and deposited by the selective deposition process P2 may be a silicon-containing material. By way of example but not limitation, the film layer 198 may be made of silicon oxide. In some embodiments, the film layer 198 may be made of III-V compound material, such as a boron containing material. By way of example but not limitation, the boron containing material may include boron, boron nitride, boron carbide, other suitable materials, and/or combinations thereof. In some embodiments, the dielectric material included in the film layer 198 and deposited by the selective deposition process P2 may be fluorocarbon. The film layer 198 is spaced apart from the dummy gate structure 180 by the gate spacer 190. In some embodiments, the film layer 198 may have a less lateral dimension than the gate spacer 190. In some embodiments, the film layer 198 may have a less lateral dimension than the spacer 192', the spacer 194', and/or the spacer 196'. By way of example but not limitation, the film layer 198 on the gate spacer 190 may have a thickness T1 in a range from about 0.1 nm to about 2 nm, such as about 0.1, 0.2, 0.4, 0.6, 0.8, 1, 1.2, 1.4, 1.6, 1.8, or 2 nm.

The selective deposition process P2 may exhibit a higher deposition rate on first dielectric surfaces (e.g. a surface of the gate spacer 190) than on second dielectric surfaces (e.g. surfaces of the semiconductor fins 152 and 154, the dielectric layer 160, and the dielectric layer 178). Therefore, the film layer 198 may be made a different material than surrounding structures (e.g. the semiconductor fins 152 and 154, the dielectric layer 160, and the dielectric layer 178). By way of example but not limitation, if the spacer 196' is made of silicon nitride (SiN), the semiconductor fins 152 and 154, the dielectric layer 160, and the dielectric layer 178 may be made of materials different than the silicon nitride. If the gate spacer 190 is made of silicon carbide (SiC), the semiconductor fins 152 and 154, the dielectric layer 160, and the dielectric layer 178 may be made of materials different than the silicon carbide. In some embodiments, the selective deposition process P2 may be performed by a furnace, an inductively coupled plasma (ICP) tool, or a capacitively coupled plasma (CCP) tool. In some embodiments, the deposition gas used in the selective deposition process P2 may include a silicon-containing precursor to deposit a silicon-containing layer. For example, the selective deposition process P2 using the silicon-containing precursors may exhibit a higher deposition rate on the material of gate spacer 190 (e.g., silicon nitride) than on other materials (e.g., material of the semiconductor fins 152 and 154, the dielectric layer 160, and the dielectric layer 178), which in turns deposits a thicker dielectric material on the gate spacer 190 than on other surfaces. In some embodiments, the selective deposition process P2 using the silicon-containing precursors may deposit the dielectric material (e.g., the gate spacer 190) on the gate spacer 190, but not on other surfaces.

Figures 12A, 12B:
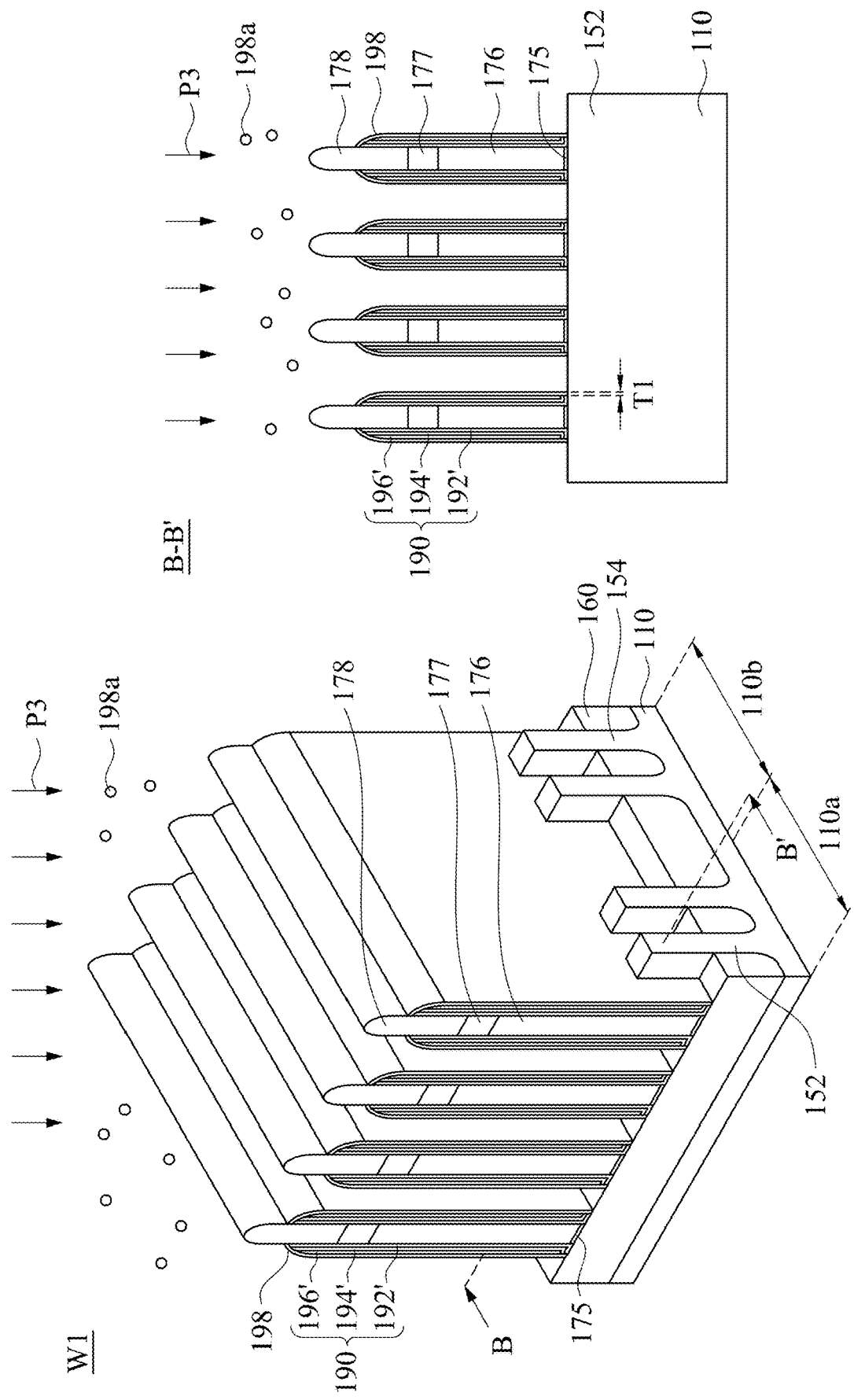

Reference is made to FIGS. 12A and 12B. An ion implantation process P3 may be performed to implant dopants 198*a* into the film layer 198, so as to adjust the etch property thereof. In some embodiments, the implanted film layer 198 may have a higher etch resistance than non-implanted film layer 198. The implanted film layer 198 may have a lattice constant different than the spacer 192', the spacer 194', the spacer 196', and/or the ILD layer 240. In some embodiments, the implantation may break the bonding of the film layer 198 so that the dopants 198*a* of the implantation are bonded to the film layer 198 in the following annealing processes. In some embodiments, the annealing process may not be performed after performing the ion implantation process P3. In some embodiments, the dopants 198*a*, such as Ge⁺ ions, may be used for the ion implantation process P3. Other suitable dopant species such as nitrogen (N), phosphorus (P), or boron (B) may be used in different examples. In some embodiments, the implant dopants 198*a* into may be doped into the spacer 192', the spacer 194', and/or the spacer 196'. By way of example but not limitation, the film layer 198 may have a higher dopant atomic concenetration than the the spacer 192', the spacer 194', and/or the spacer 196'. In some embodiments, the the the spacer 192', the spacer 194', and/or the spacer 196' may be dopant-free. In some embodiments, the ion implantation process P3 and the selective deposition process P2 may be in-situ performed. In some embodiments, the ion implantation process P3 and the selective deposition process P2 may be ex-situ performed.

Figure 13A:
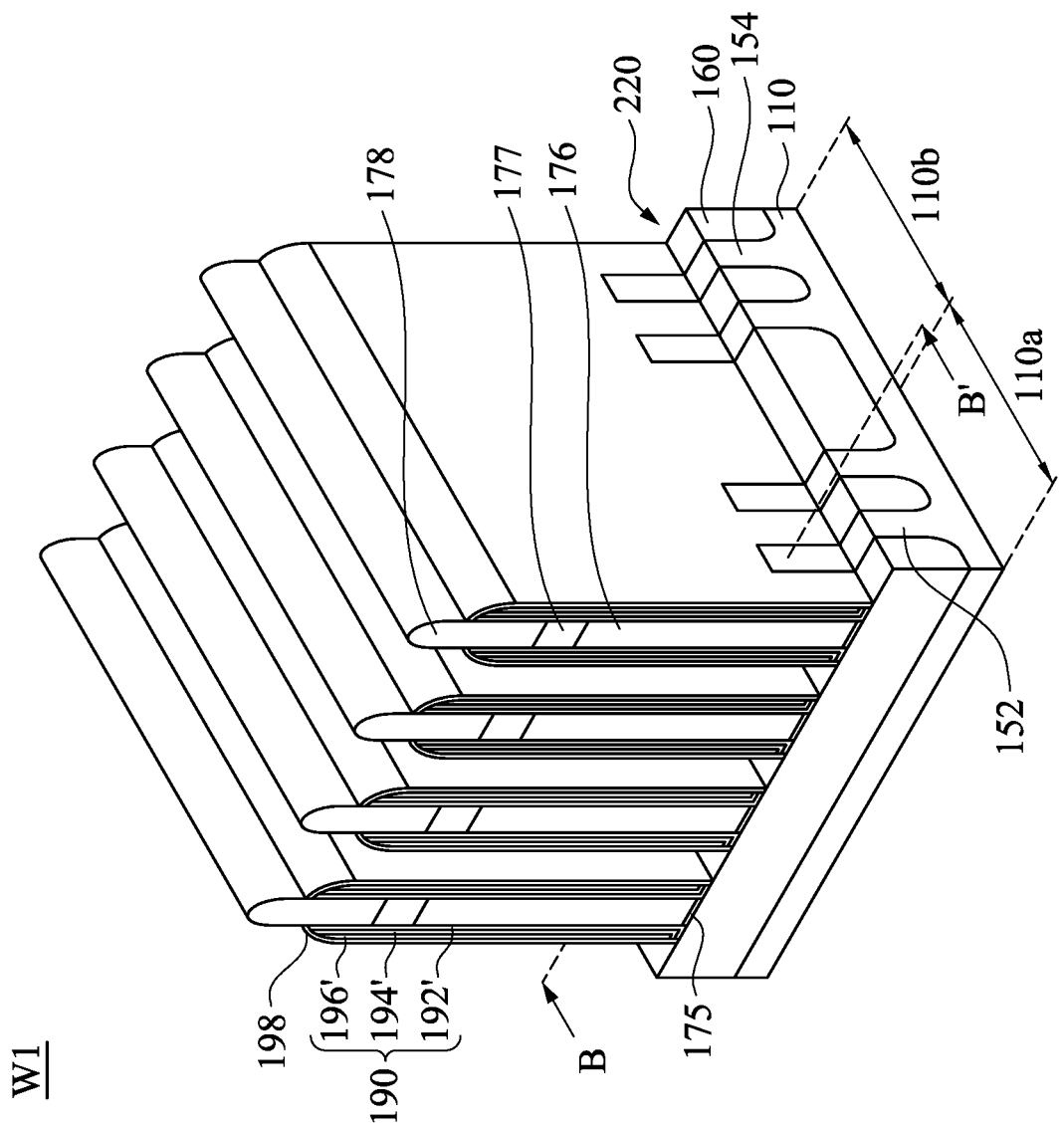
Figure 13C:
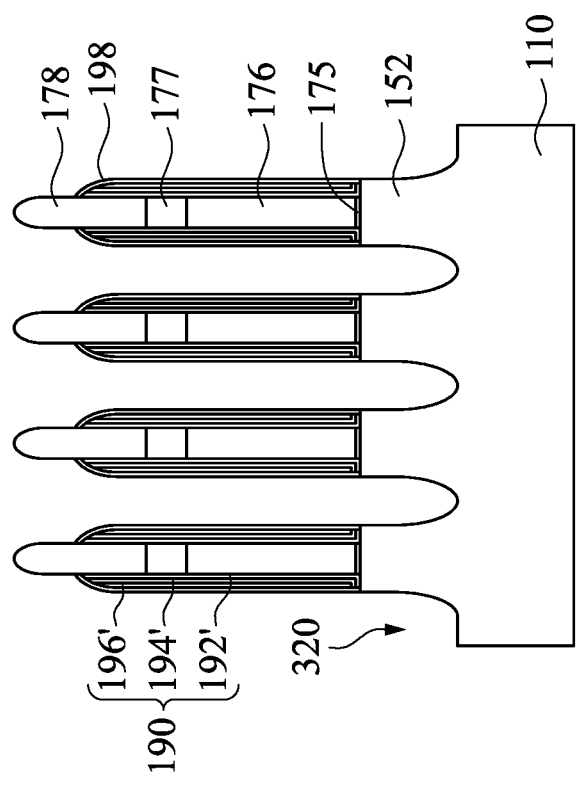
Figure 13B:
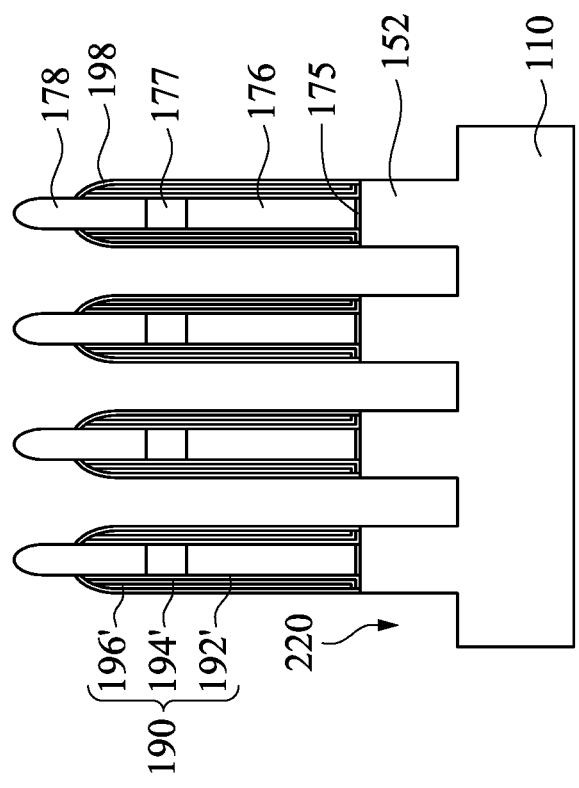

Reference is made to FIGS. 13A and 13B. Portions of the semiconductor fins 152 and 154 not covered by the dummy gate structures 180 and the gate spacers 190 and the film layer 198 are recessed to form recesses 220. Formation of the recesses 220 may include a dry etching process, a wet etching process, or combination dry and wet etching processes. This etching process may include reactive ion etch (RIE) using the dummy gate structures 180, the gate spacers 190, and the film layer 198 as masks, or by any other suitable removal process. After the etching process, a pre-cleaning process may be performed to clean the recesses 220 with hydrofluoric acid (HF) or other suitable solution in some embodiments.

FIG. 13C illustrates a cross-sectional view of a semiconductor structure corresponding to FIG. 13B in accordance with some embodiments of the present disclosure. While FIG. 13C shows another embodiment of recesses 320 having different profiles than the recesses 220 as shown in FIG. 13B. In addition, the present disclosure may repeat reference numerals and/or letters in the various examples. This repetition is for the purpose of simplicity and clarity and does not in itself dictate a relationship between the various embodiments and/or configurations discussed. As shown in FIG. 13B, the recess 220 may be formed to have vertical sidewalls from the cross-sectional view. In some embodiments, the the recess 220 may have different profiles than the circular patterns. As shown in FIG. 13C, the recess 320 may have curved sidewall from the cross-sectional view.

Figure 14:
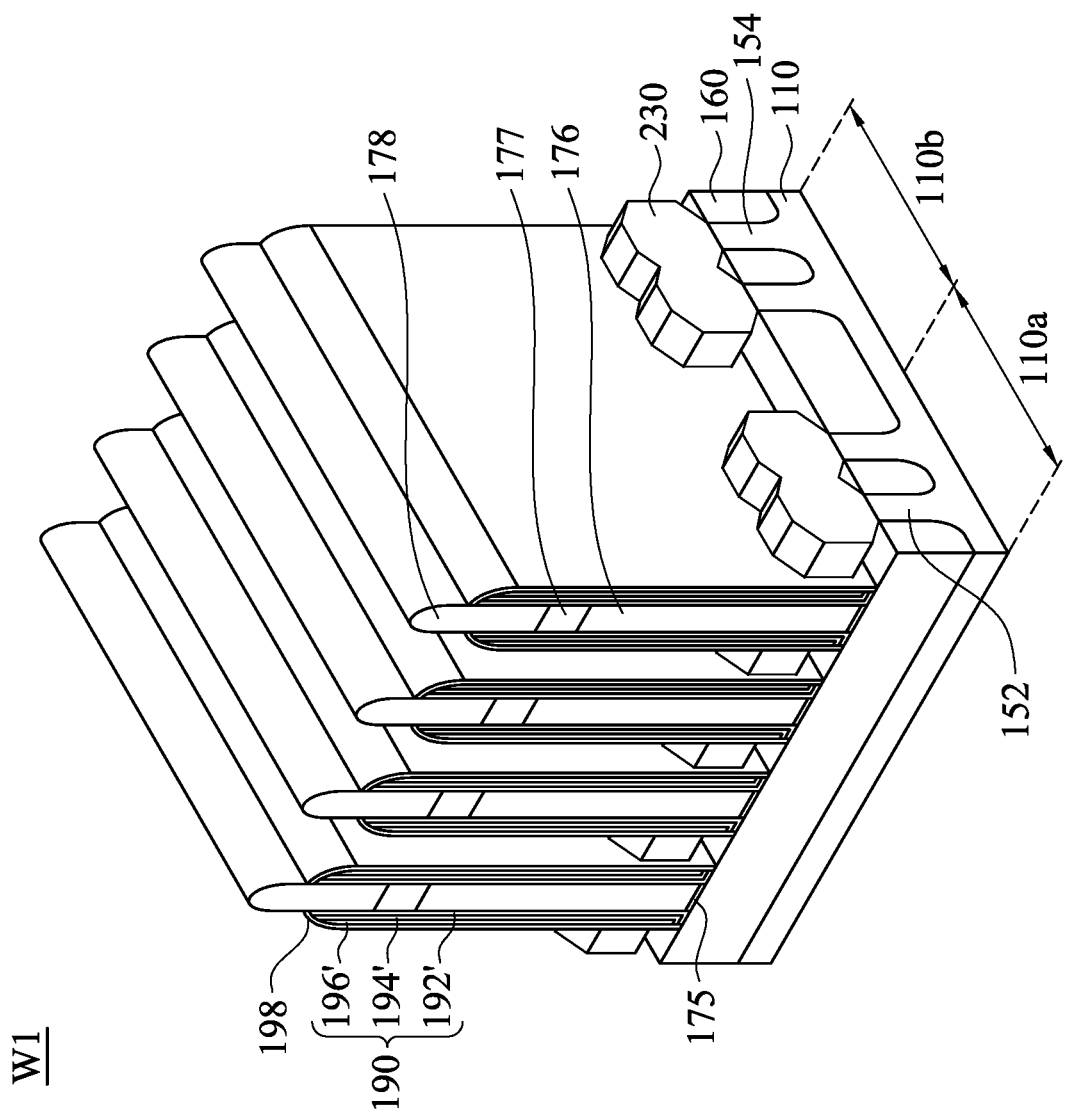

Reference is made to FIG. 14. Epitaxial source/drain structures 230 are respectively formed in the recesses 200 to form an n-channel metal-oxide semiconductor (NMOS) transistor or a p-channel metal-oxide semiconductor (PMOS) transistor. In some embodiments, stress may enhance carrier mobility and performance of the MOS. The epitaxial source/drain structures 230 may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fins 152 and 154. The epitaxial source/drain structures 230 can be formed in different epitaxy processes. The epitaxial source/drain structures 230 may include semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial source/drain structures 230 have suitable crystallographic orientation (e.g., a (100), (110), or (111) crystallographic orientation). In some embodiments, lattice constants of the epitaxial source/drain structures 230 are different from that of the semiconductor fins 152 and 154, so that the channel region between the epitaxial source/drain structures 230 can be strained or stressed by the epitaxial source/drain structures 230 to improve carrier mobility of the semiconductor device and enhance the device performance.

In some embodiments, the epitaxial source/drain structure 230 may be an n-type epitaxy structure or a p-type epitaxy structure. The epitaxial source/drain structure may include SiP, SiC, SiPC, Si, III-V compound semiconductor materials or combinations thereof. In some embodiments, during the formation of the epitaxial source/drain structure 230, n-type impurities such as phosphorous or arsenic may be doped with the proceeding of the epitaxy. By way of example and not limitation, when the epitaxial source/drain structure 230 includes SiC or Si, n-type impurities are doped. Moreover, in some embodiments, during the formation of the epitaxial source/drain structure 230, p-type impurities such as boron or BF$_2$ may be doped with the proceeding of the epitaxy. By way of example and not limitation, when the epitaxial source/drain structure 230 includes SiGe, p-type impurities are doped.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 152 and 154 (e.g., silicon, silicon germanium, silicon phosphate, or the like). The epitaxial source/drain structures 230 may be in-situ doped. The doping species include p-type dopants, such as boron or $BF_2$; n-type dopants, such as phosphorus or arsenic; and/or other suitable dopants including combinations thereof. If the epitaxial source/drain structures 230 are not in-situ doped, a second implantation process (i.e., a junction implant process) is performed to dope the epitaxial source/drain structures 230. One or more annealing processes may be performed to activate the epitaxial source/drain structures 230. The annealing processes include rapid thermal annealing (RTA) and/or laser annealing processes. In some embodiments, the epitaxial source/drain structures 230 can be interchangeably referred to sources/drain regions, sources/drain patterns, or epitaxial structures. In some embodiments, forming epitaxial source/drain structure 230 and the ion implantation process P3 may be in-situ performed. In some embodiments, forming epitaxial source/drain structure 230 and the ion implantation process P3 may be ex-situ performed.

Figure 15:
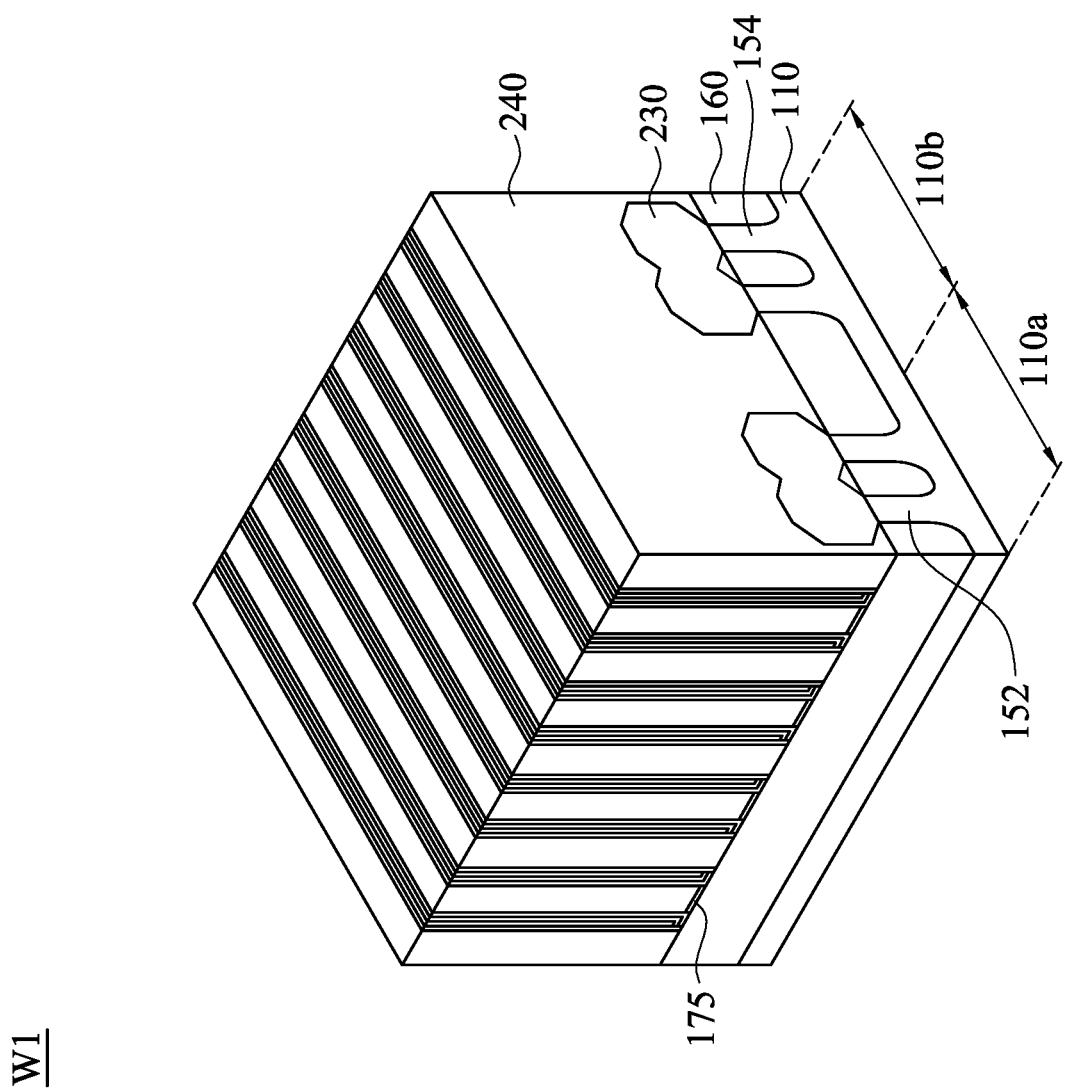

Reference is made to FIG. 15. An interlayer dielectric (ILD) layer 240 is formed over the source/drain structures 230, the dummy gate structures 180 and the gate spacers 190, and the film layer 198, followed by performing a CMP process to remove portions of the ILD layer 240, the gate spacers 190, the film layer 198, the dielectric layers 177 and 178, and the dummy gate electrode layer 176 to expose a lower portion of the dummy gate electrode layer 176. The CMP process may planarize a top surface of the ILD layer 240 with top surfaces of the dummy gate electrode layer 176, gate spacers 190, and the film layer 198. In some embodiments, the ILD layer 240 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 240 may be formed using, for example, CVD, ALD, spin-on-glass (SOG) or other suitable techniques.

Figure 16:
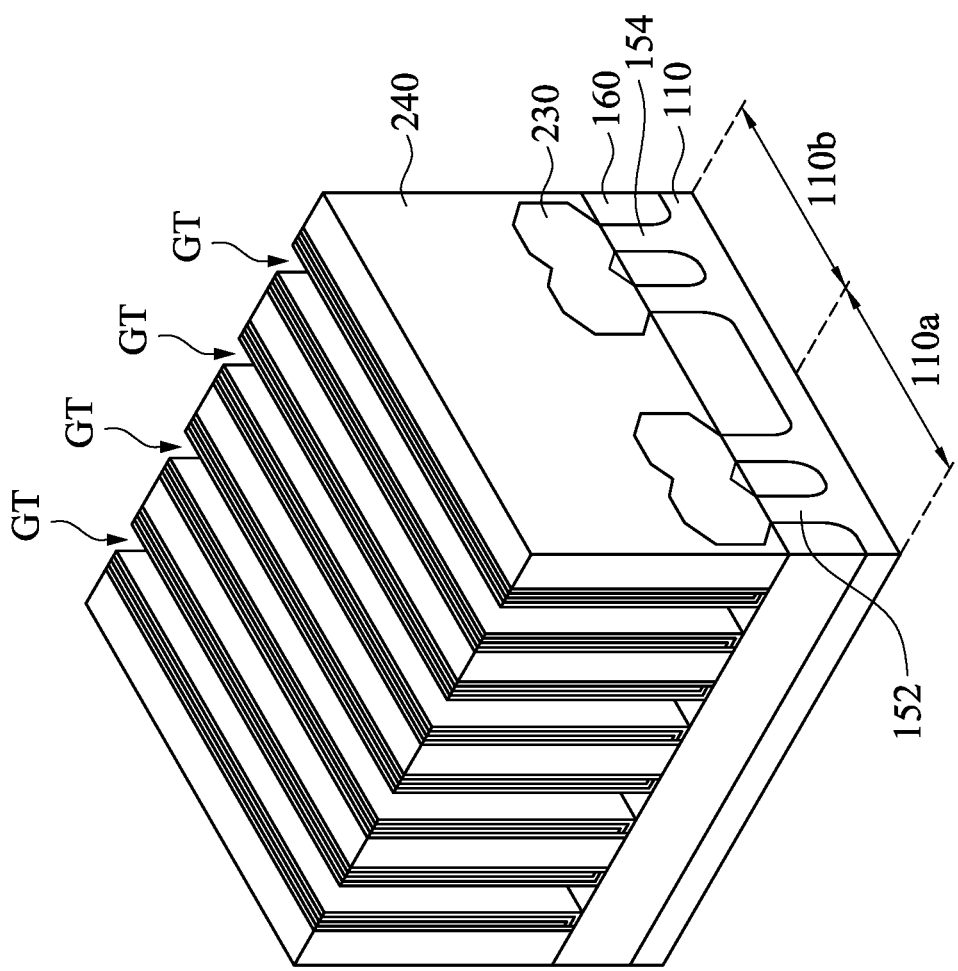

Reference is made to FIG. 16. Dummy gate structures 180 (see in FIG. 15) including the gate dielectric layer 175 and the dummy gate electrode layer 176 are removed to form gate trenches GT with the gate spacers 190 as their sidewalls. Widths of the gate trenches GT are associated with the corresponding dummy gate structures 180. In some embodiments, the dummy gate structures 180 are removed by performing a first etching process and performing a second etching process after the first etching process. In some embodiments, the dummy gate electrode layer 176 (see FIG. 15) is mainly removed by the first etching process, and the gate dielectric layer 175 (see FIG. 15) is mainly removed by the second etching process that employs a different etchant than that used in the first etching process. In some embodiments, the dummy gate electrode layer 176 is removed, while the gate dielectric layer 175 remains in the gate trenches GT.

Figure 17:
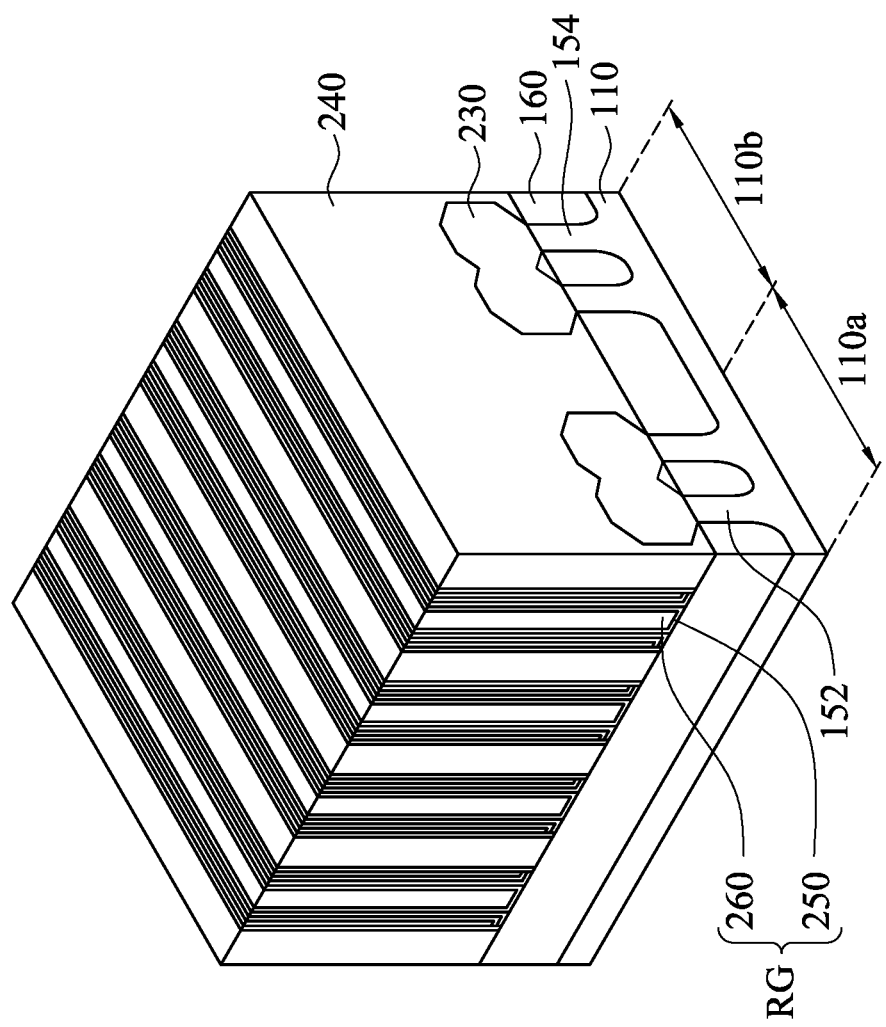

Reference is made to FIG. 17. Replacement gate structures RG are respectively formed in the gate trenches GT. An exemplary method of forming these replacement gate structures may include blanket forming a gate dielectric layer over the wafer W1, forming one or more work function metals over the blanket gate dielectric layer, and performing a CMP process to remove excessive materials of the one or more work function metals and the gate dielectric layer outside the gate trenches GT. As a result of this method, the replacement gate structures RG each include a gate dielectric layer 250 and a work function metal 260 wrapped around by the gate dielectric layer 250. In some embodiments, the gate structure RG can be interchangeably referred to a gate pattern, a gate strip, or a nanostructured pedestal.

In some embodiments, the gate dielectric layer 250 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 250 may include hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layer 250 may have a multilayer structure such as one layer of silicon oxide (e.g., interfacial layer) and another layer of high-k material. In some embodiments, the gate dielectric layer 250 is made of the same material because they are formed from the same dielectric layer blanket deposited over the substrate 110.

The work function metal 260 includes suitable work function metals to provide suitable work functions. In some embodiments, the work function metal 260 may include one or more n-type work function metals (N-metal) for forming an n-type transistor on the substrate 110. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function metal 260 may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. At least two of the work function metals 260 are made of different work function metals so as to achieve suitable work functions in some embodiments. In some embodiments, an entirety of the work function metal 260 is a work function metal. In some embodiments, the term "work function" refers to the minimum energy (usually expressed in electron volts) needed to remove an electron from a neutral solid to a point immediately outside the solid surface (or energy needed to move an electron from the Fermi energy level into vacuum). Here "immediately" means that the final electron position is far from the surface on the atomic scale but still close to the solid surface on the macroscopic scale.

Subsequently, the isolation structures 280' (see FIGS. 20A-20C) as a gate-cut structure for the gate structure are formed. The gate-cut structure is formed by a cut metal gate (CMG) process as shown in FIGS. 18A-20C. In some embodiments, the isolation structure 280' can be interchangeably referred to gate end dielectrics, dielectric structure, isolation strip, or dielectric regions.

Figure 18A:
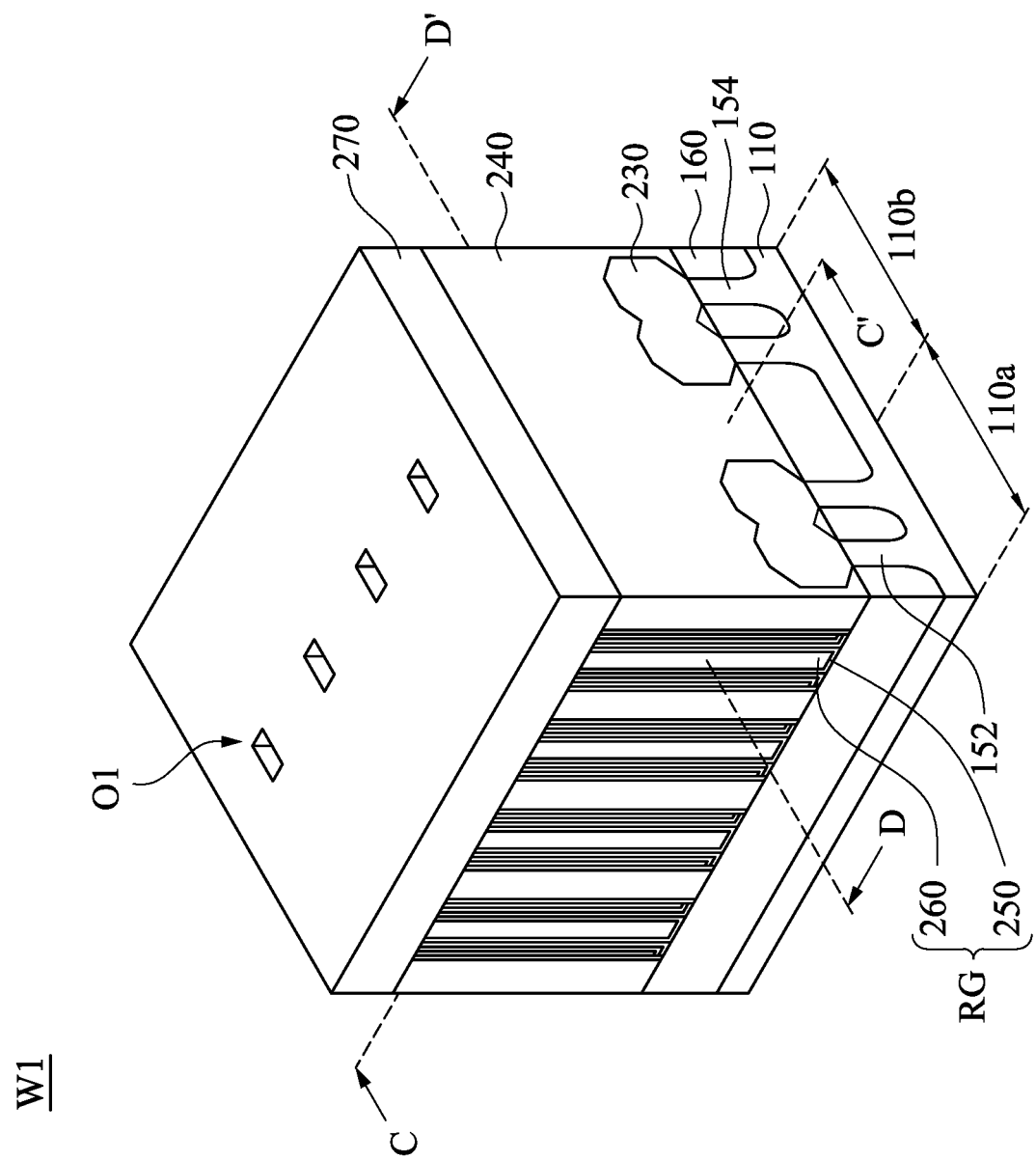
Figure 18C:
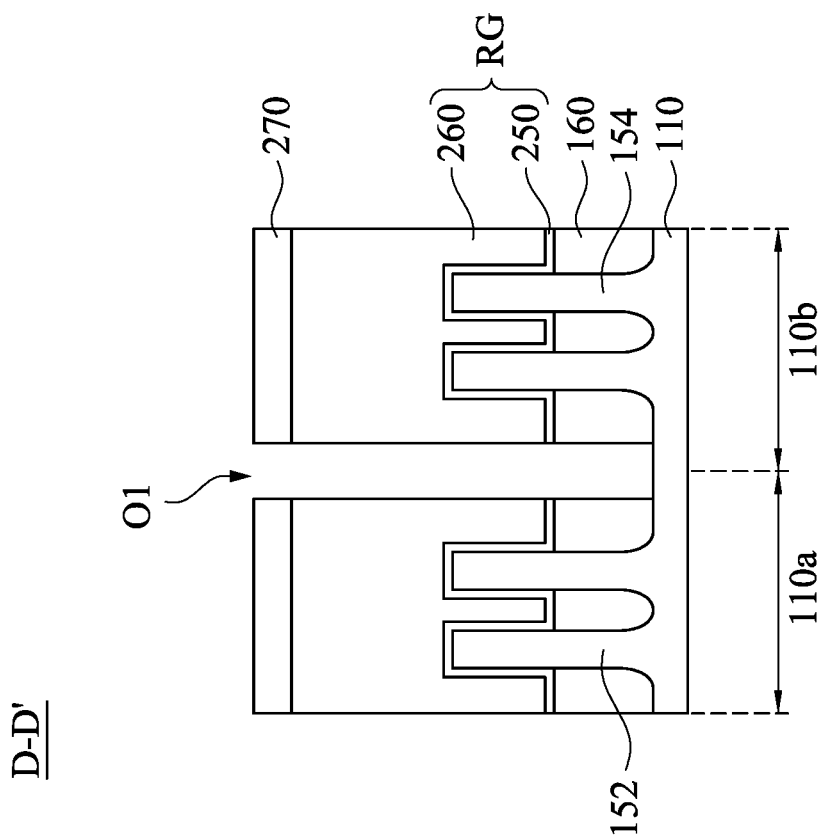
Figure 18B:
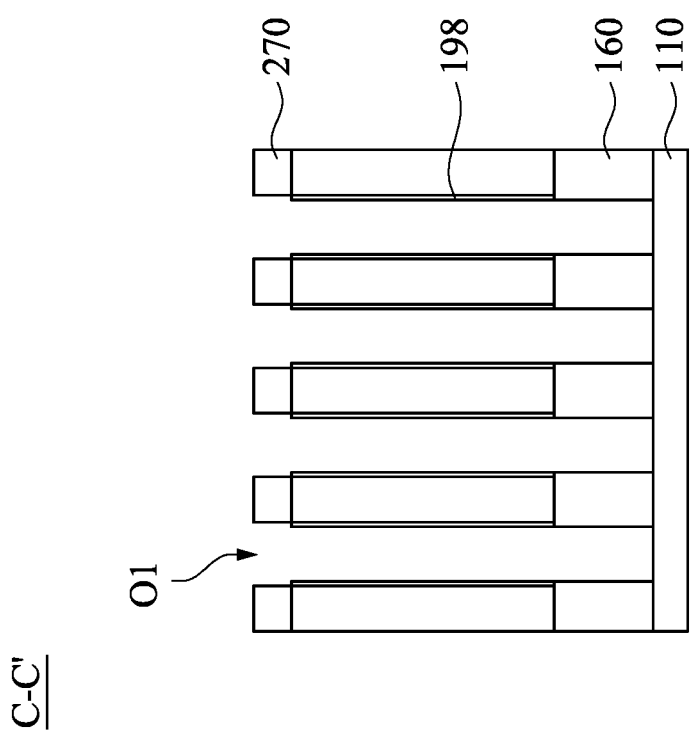

Reference is made to FIGS. 18A, 18B, and 18C. A hard mask layer 270 is deposited over the gate structure RG, the ILD layer 240, the gate spacers 190, and the film layer 198 and can serve as a protection layer to its underlying component. In some embodiments, the hard mask layer 270 may be made of SiO, SiN, SiOC, and SiOCN. A patterned mask (not shown) is formed over the hard mask layer 270 to define a masked region 270a and an unmasked region 270b on the hard mask layer 270. In other words, the patterned mask exposes the unmasked region 270b on the hard mask layer 270, and the masked region 270a on the hard mask layer 270 may be protected by the patterned mask during processes performed later. Subsequently, one or more etching processes are performed using the patterned mask as an etching mask to remove the unmasked region 270b of the hard mask layer 270, such that portions of the gate structures RG are exposed. Subsequently, one or more etching processes are performed through the patterned hard mask layer 270 to etch the exposed portions of the gate structures RG until the substrate 110 is exposed and forms openings O1 to reappear portions of the gate trenches GT with the gate spacers 190 as their sidewalls. In some embodiments, the openings O1 may further downwardly extend to a positon in the substrate 100. The portions of the gate structures RG may be removed by dry etching, wet etching, or a combination of dry and wet etching. For example, a wet etching process may include exposure to a hydroxide containing solution (e.g., ammonium hydroxide), deionized water, and/or other suitable etchant solutions.

In some embodiments, the etching process on the gate structures RG would consume at least one of the first, second, and third spacers 192', 194', and 196', and thus the first, second, and third spacers 192', 194', and 196' may be damaged or removed as shown in FIG. 18B. If the gate spacer 190 does not have the film layer 198 formed thereon, the etching process on the gate structures RG may further etch the dielectric layer 160 to laterally expand the openings O1, materials of the gate structures RG may flow into the expanded regions of the openings, which in turn occurs a leakage current to flow between the gate structure 170 and a source/drain contact 290 formed subsequently in the dielectric layer 160, which in turn reduces the yield of the semiconductor device. Therefore, an additional film layer 198 as shown in FIG. 17 may be formed over the gate spacer 190 to confined the space of the opening O1, which in turn prevents a leakage current from flowing between the source/drain contact 290 and the gate structure RG, and thus the yield of the semiconductor device can be improved.

Figure 19A:
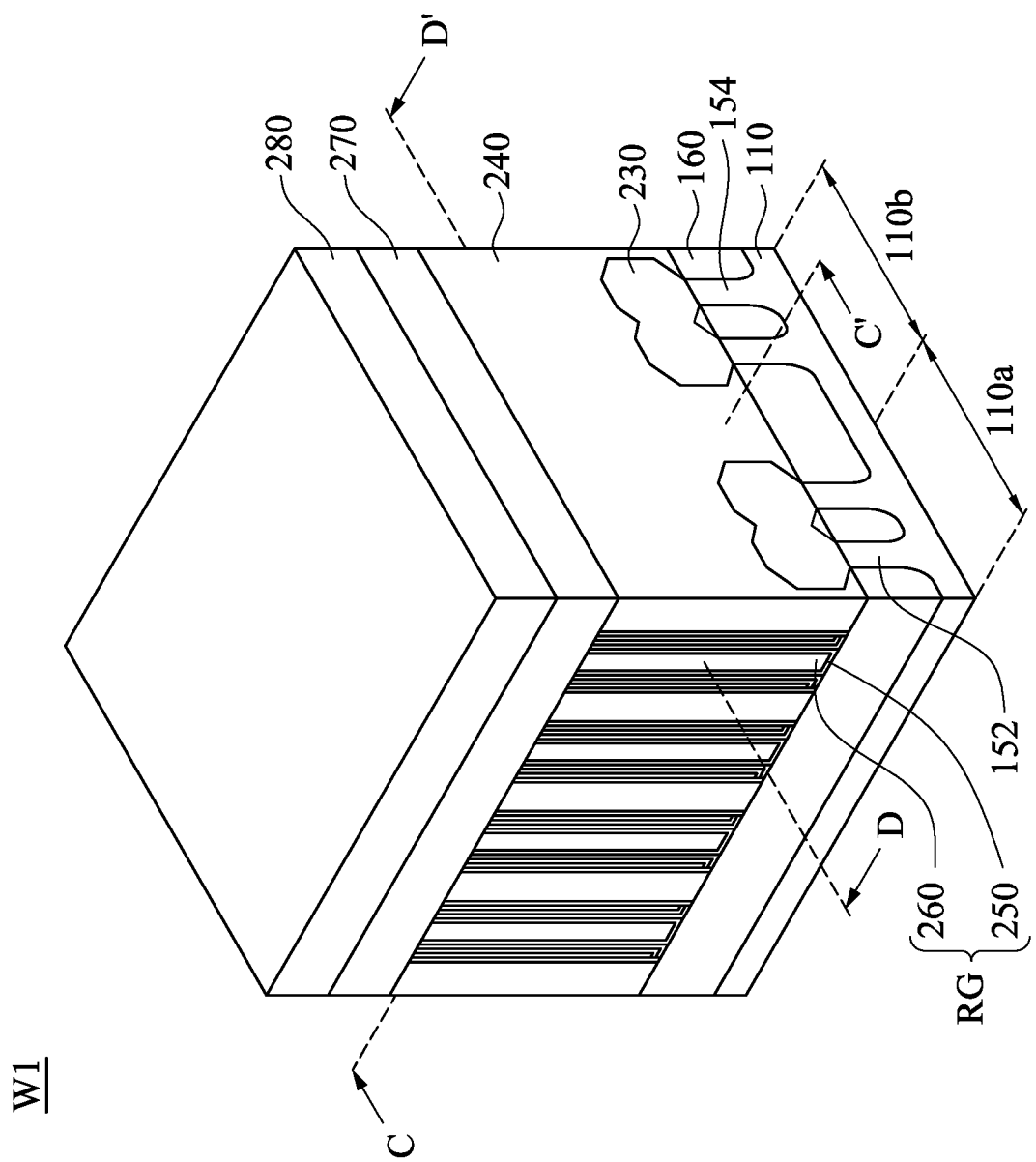
Figure 19C:
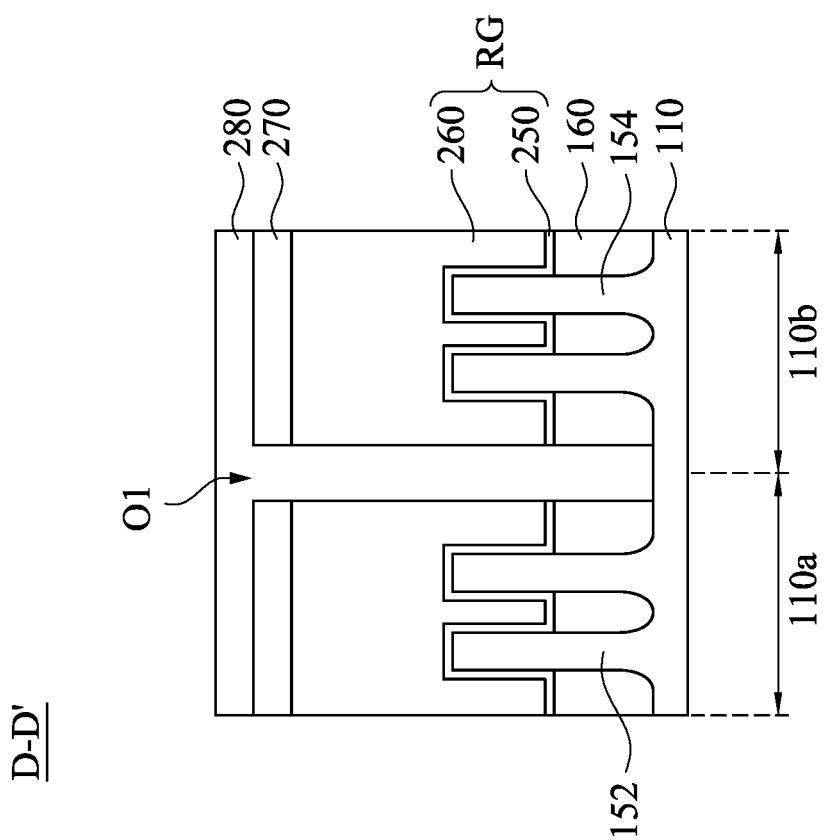
Figure 19B:
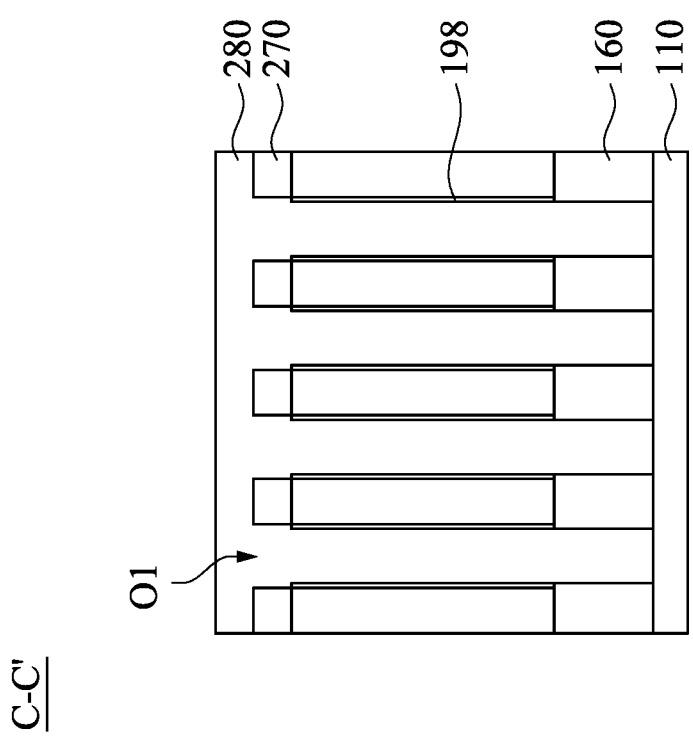

Reference is made to FIGS. 19A, 19B, and 19C. A dielectric material 280 is deposited into the opening O1 and formed over the hard mask layer 270. In some embodiment, the dielectric material 280 may be a single layer or multiple layers. In some embodiments, the deposition of the dielectric material 280 may be performed using a deposition process such as PVD, CVD, ALD, which may be PEALD, thermal ALD, or the like. In some embodiments, the dielectric material 280 may be made of a low-K isolation material, such as having a dielectric constant less than about 5 (e.g., about 5, 4, 3.24, 3, 2, or 1). The dielectric material 280 may be formed of or comprise $SiO_2$, SiOC, SiOCN, or the like, or combinations thereof. In some embodiments, the dielectric material 280 may be made of a nitride-based material, such as $Si_3N_4$, or a carbon-based material, such as SiOCN, or combinations thereof. In some embodiments, the dielectric material 280 may be made of a material having a dielectric constant greater than about 9 (e.g., high dielectric constant (high-k) material). For example, the dielectric material 280 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. The dielectric material 280 may be formed of a homogenous material, or may have a composite structure including more than one layer. The dielectric material 280 may include dielectric liners, which may be formed of, for example, silicon oxide. In some embodiments, the dielectric material of the dielectric material 280 comprises SiN, and the deposition is performed using process gases including dichlorosilane and ammonia. Hydrogen ($H_2$) may or may not be added.

Figure 20A:
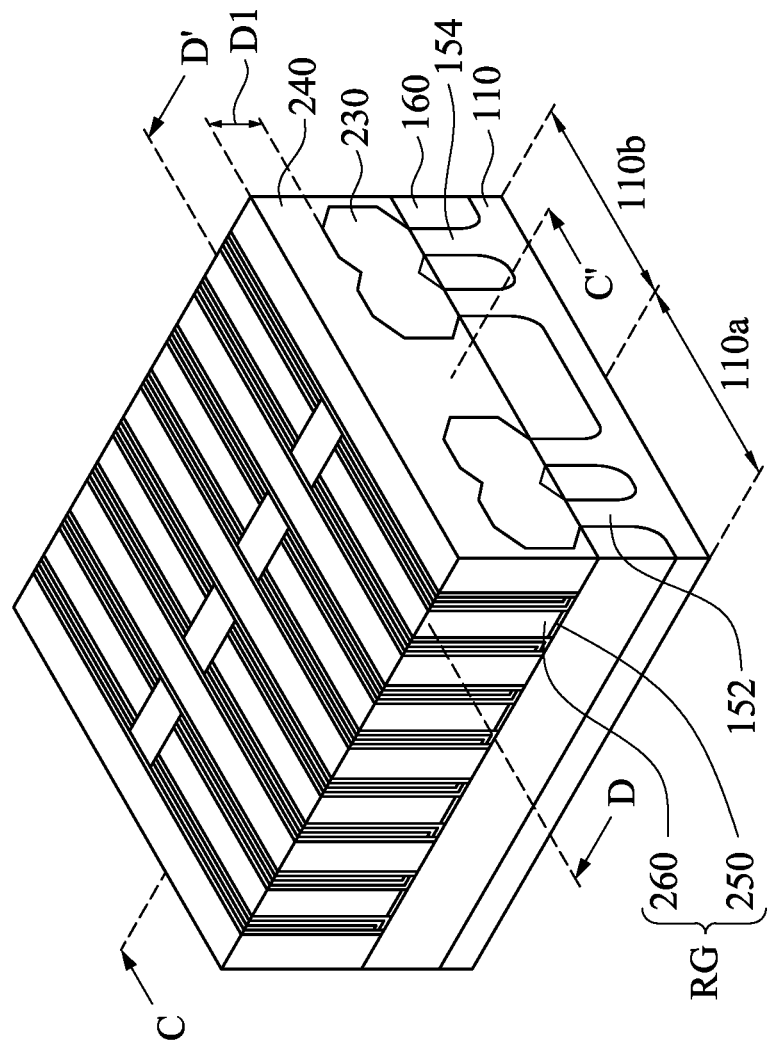
Figure 20B:
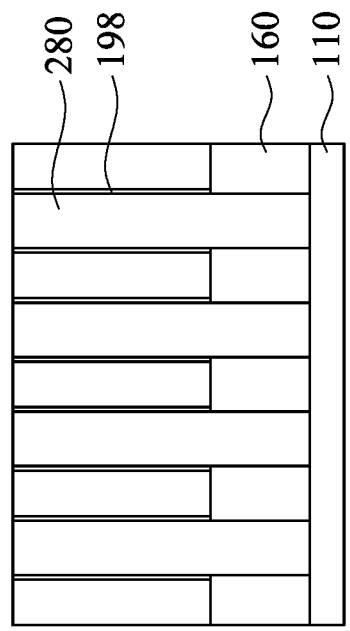
Figure 20C:
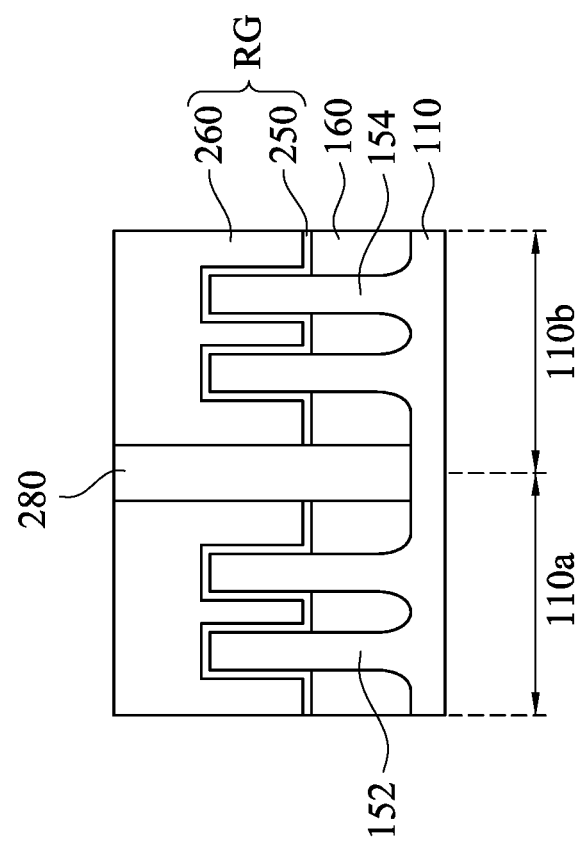
Figure 20D:
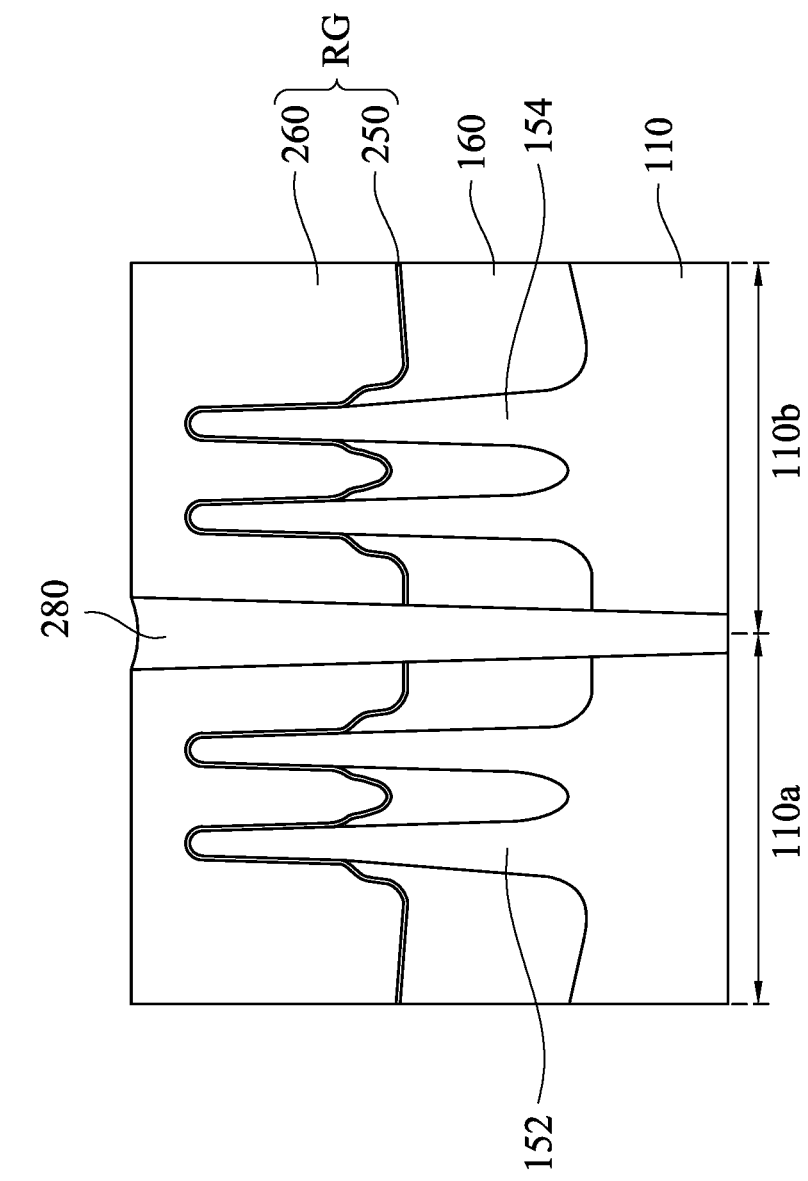
Figure 21A:
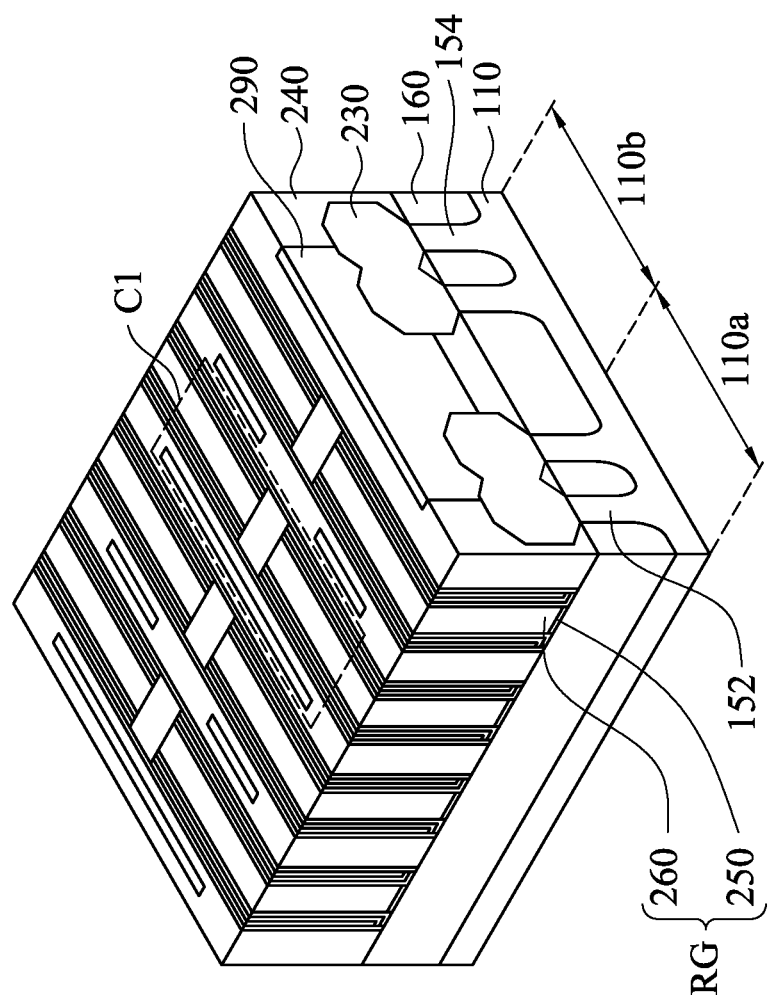

Reference is made to FIGS. 20A, 20B, and 20C. A planarization process, such as chemical mechanical polish (CMP) process, is performed to remove excessive material of the dielectric material 280 and the hard mask layer 270 to expose the gate structure RG, the gate spacer 190, and/or the ILD layer 240. In some embodiment, the gate structure RG may be further thinned down during the CMP process, such that a distance D1 between the epitaxial source/drain structures 230 and a top surface of the gate structure RG may be in a range from about 10 nm to about 20 nm, such as about 10, 11, 12, 13, 14, 15, 16, 17, 18, 19, or 20 nm. The remaining of dielectric material 280 forms the isolation structures 280'. In some embodiments, the planarization process may planarize a top surface of the ILD layer 240 with top surfaces of the gate structure RG and/or the gate spacer 190.

Reference is made to FIG. 20D. FIG. 20D illustrates a cross-sectional view of a semiconductor structure corresponding to FIG. 20C in accordance with some embodiments of the present disclosure. While FIG. 20D shows another embodiment of a semiconductor structure having different profiles than the semiconductor structure as shown in FIG. 19C. In addition, the present disclosure may repeat reference numerals and/or letters in the various examples. This repetition is for the purpose of simplicity and clarity and does not in itself dictate a relationship between the various embodiments and/or configurations discussed. In FIG. 20C, the openings O1 may extend downwardly and terminate at a top surface of the substrate 110. In FIG. 20D, the openings O1 may further downwardly extend to a positon in the substrate 100.

Reference is made to FIGS. 21A, 21B, 21C, and 21D. Source/drain contacts 290 are formed through the ILD layer 240 and in contact with the epitaxy structures 170. An exemplary formation method of the source/drain contacts 290 may include forming contact holes by one or more etching processes to sequentially etch through the ILD layer 240 down to the respective epitaxial source/drain structures 230, and depositing metal or other suitable conductive materials in the contact holes by a deposition process, such as PVD process, CVD process, to form the source/drain contacts 290. In some embodiments, the source/drain contacts 290 may be made of a metal-containing material such as titanium nitride, titanium oxide, tungsten, cobalt, ruthenium, aluminum, copper, combinations thereof, multi-layers thereof, or the like. Because the isolation structure 280' is confined by the film layer 198, the isolation structure 280' can have a square-profile top view or a rectangular-profile top view (see FIG. 21B) and a trapezoidal-profile cross-sectional view (see FIG. 21D). For example, from the top view as shown in FIG. 21B, the isolation structure 280' can have opposite edges 280c, 280e in parallel with each other and opposite edges 280d, 280f in parallel with each other and forms a linear boundary with the gate structure RG. The source/drain contacts 290 laterally extends past the isolation structure 280' from the top view.

While FIG. 21C shows another embodiment of a gate structure and a source/drain contact having different profiles than the gate structure RG and the source/drain contact 290 as shown in FIGS. 20A-20C. In addition, the present disclosure may repeat reference numerals and/or letters in the various examples. This repetition is for the purpose of simplicity and clarity and does not in itself dictate a relationship between the various embodiments and/or configurations discussed. As shown in FIGS. 21C and 21D, the gate structure RG (see FIG. 21C), the isolation structure 280' (see FIG. 21D), the source/drain contact 290 may have tapered sidewalls. In other words, a bottom portion of the source/drain contact 290 may have a narrower width than an upper portion of the source/drain contact 290, a bottom portion of the isolation structure 280' may have a narrower width than an upper portion of the isolation structure 280', and a bottom portion of the gate structure RG may have a narrower width than an upper portion of the gate structure RG. Therefore, the gate spacer 190 (see FIG. 21C) formed on the gate structure RG may incline relative to a top surface of the substrate, and also the film layer 198 formed on the gate structure RG may incline relative to the top surface of the substrate. The film layer 198 formed on the gate spacer 190 (see FIG. 21C) or the isolation structure 280' (see FIG. 21C) may incline relative to the top surface of the substrate.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a film layer formed on the gate spacer. During the etching process on the gate pattern, the film layer have a higher etch resistance to an etchant of the etching process than the gate spacer, which in turn allows for resisting against the etching process. Therefore, the film layer can prevent a leakage current from occurring between the gate pattern and a source/drain contact formed subsequently in the surrounding dielectric layer, and can be served as a leakage barrier.

In some embodiments, a method includes forming a semiconductor fin upwardly extending from a substrate; forming a gate strip extending across the semiconductor fin; forming source/drain regions on the semiconductor fin and at opposite sides of the gate strip; forming a gate spacer on a sidewall of the gate strip; forming a film layer on the gate spacer; performing an etching process on the gate strip to break the gate strip into a first gate structure and a second gate structure, the etching process further consuming the gate spacer while remains the film layer; forming an isolation structure interposing the first and second gate structures. In some embodiments, the film layer is made of a silicon-containing material. In some embodiments, the film layer has a lower nitrogen atomic concentration than the gate spacer. In some embodiments, the method further includes depositing an interlayer dielectric (ILD) layer laterally surrounding the gate strip, wherein the film layer has a different silicon atomic concentration than the ILD layer. In some embodiments, the method further includes depositing an interlayer dielectric (ILD) layer laterally surrounding the gate strip, wherein the film layer has a different density than the ILD layer. In some embodiments, forming the film layer is performed by using a furnace. In some embodiments, the method further includes implanting a dopant into the film layer. In some embodiments, the dopant comprises germanium, nitrogen, phosphorus, or boron. In some embodiments, the film layer has a thickness in a range from about 0.1 nm to about 2 nm. In some embodiments, the gate spacer is made of silicon nitride. In some embodiments, the film layer is made of silicon oxide doped with germanium, nitrogen, phosphorus, or boron. In some embodiments, the isolation structure has a dielectric constant less than about 5. In some embodiments, the isolation structure is made of SiOC.

In some embodiments, a method includes forming first and second semiconductive channel patterns on a substrate; forming a gate pattern extending across the first and second semiconductive channel patterns; forming first source/drain patterns on the first semiconductive channel pattern and at opposite sides of the gate pattern and forming second source/drain patterns on the second semiconductive channel pattern and at opposite sides of the gate pattern; forming a first spacer layer on a sidewall of the gate pattern; selectively forming a leakage barrier on the first spacer layer; impaling a dopant into the leakage barrier; patterning the gate pattern to form a first gate structure extending across the first semiconductive channel pattern and a second gate structure extending across the second semiconductive channel pattern; depositing a dielectric material over the substrate and in contact with a longitudinal end of the first gate structure and a longitudinal end of the second gate structure. In some embodiments, the leakage barrier has a lower nitrogen atomic concentration than the first spacer layer. In some embodiments, the first spacer layer is dopant-free. In some embodiments, the dielectric material is made of silicon oxy-carbo-nitride. In some embodiments, the method further includes forming a second spacer layer on the sidewall of the gate pattern prior to forming the first spacer layer, the second spacer layer having a higher oxygen atomic concentration than the first spacer layer.

In some embodiments, the semiconductor structure includes a semiconductor substrate, a nanostructured pedestal, a gate strip, epitaxial structures, an isolation structure, a spacer, and a doped silicon oxide layer. The nanostructured pedestal is on the semiconductor substrate and having a top surface and opposite side surfaces. The gate strip wraps around the top surface and the opposite side surfaces of the nanostructured pedestal. The epitaxial structures are on the nanostructured pedestal and at opposite sides of the gate strip. The isolation structure abuts a longitudinal end of the gate strip and forming a linear boundary with the gate strip. The isolation structure has a rectangular profile from a top view and a trapezoidal profile from a cross-sectional view. The spacer lines a sidewall of the gate strip. The doped silicon oxide layer lines a sidewall of the isolation structure. In some embodiments, the doped silicon oxide layer is in contact with the isolation structure. In some embodiments, the doped silicon oxide layer further forms on the spacer. In some embodiments, the doped silicon oxide layer has a lower nitrogen atomic concentration than the spacer. In some embodiments, the isolation structure has an upper portion having a narrower width than a lower portion of the isolation structure from a cross-sectional view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a semiconductor fin upwardly extending from a substrate;
   forming a gate strip extending across the semiconductor fin;
   forming source/drain regions on the semiconductor fin and at opposite sides of the gate strip;
   forming a gate spacer on a sidewall of the gate strip;
   forming a film layer on the gate spacer;
   performing an etching process on the gate strip to break the gate strip into a first gate structure and a second gate structure, the etching process further consuming the gate spacer while remains the film layer; and
   forming an isolation structure interposing the first and second gate structures.

2. The method of claim 1, wherein the film layer is made of a silicon-containing material.

3. The method of claim 1, wherein the film layer has a lower nitrogen atomic concentration than the gate spacer.

4. The method of claim 1, further comprising:
   depositing an interlayer dielectric (ILD) layer laterally surrounding the gate strip, wherein the film layer has a different silicon atomic concentration than the ILD layer.

5. The method of claim 1, further comprising:
   depositing an interlayer dielectric (ILD) layer laterally surrounding the gate strip, wherein the film layer has a different density than the ILD layer.

6. The method of claim 1, wherein forming the film layer is performed by using a furnace.

7. The method of claim 1, further comprising implanting a dopant into the film layer.

8. The method of claim 1, wherein the film layer is made of silicon oxide doped with germanium, nitrogen, phosphorus, or boron.

9. The method of claim 1, wherein the isolation structure has a dielectric constant less than about 5.

10. The method of claim 1, wherein the isolation structure is made of SiOC.

11. A method, comprising:
    forming first and second semiconductive channel patterns on a substrate;
    forming a gate pattern extending across the first and second semiconductive channel patterns;
    forming first source/drain patterns on the first semiconductive channel pattern and at opposite sides of the gate pattern and forming second source/drain patterns on the second semiconductive channel pattern and at opposite sides of the gate pattern;
    forming a first spacer layer on a sidewall of the gate pattern;
    selectively forming a leakage barrier on the first spacer layer;
    impaling a dopant into the leakage barrier;
    patterning the gate pattern to form a first gate structure extending across the first semiconductive channel pattern and a second gate structure extending across the second semiconductive channel pattern; and
    depositing a dielectric material over the substrate and in contact with a longitudinal end of the first gate structure and a longitudinal end of the second gate structure.

12. The method of claim 11, wherein the leakage barrier has a lower nitrogen atomic concentration than the first spacer layer.

13. The method of claim 11, wherein the first spacer layer is dopant-free.

14. The method of claim 11, wherein the dielectric material is made of silicon oxy-carbo-nitride.

15. The method of claim 11, further comprising:
    forming a second spacer layer on the sidewall of the gate pattern prior to forming the first spacer layer, the second spacer layer having a higher oxygen atomic concentration than the first spacer layer.

16. A semiconductor structure, comprising:
    a semiconductor substrate;
    a nanostructured pedestal on the semiconductor substrate and having a top surface and opposite side surfaces;
    a gate strip wrapping around the top surface and the opposite side surfaces of the nanostructured pedestal;
    epitaxial structures on the nanostructured pedestal and at opposite sides of the gate strip;
    an isolation structure abutting a longitudinal end of the gate strip and forming a linear boundary with the gate strip, wherein the isolation structure has a rectangular profile from a top view and a trapezoidal profile from a cross-sectional view;
    a spacer lining a sidewall of the gate strip;
    a first doped silicon oxide leakage barrier lining a sidewall of the spacer opposite to the gate strip, wherein the first doped silicon oxide leakage barrier comprises an implanted dopant; and
    a second doped silicon oxide leakage barrier lining a sidewall of the isolation structure.

17. The semiconductor structure of claim 16, wherein the second doped silicon oxide leakage barrier is in contact with the isolation structure.

18. The semiconductor structure of claim 16, wherein the second doped silicon oxide leakage barrier has a lower nitrogen atomic concentration than the spacer.

19. The semiconductor structure of claim 16, wherein the isolation structure has an upper portion having a narrower width than a lower portion of the isolation structure from the cross-sectional view.

20. The semiconductor structure of claim 16, wherein the first doped silicon oxide leakage barrier is doped with germanium, nitrogen, phosphorus, or boron.

* * * * *